US011682433B2

United States Patent
Yuh et al.

(10) Patent No.: US 11,682,433 B2
(45) Date of Patent: Jun. 20, 2023

(54) MULTIPLE STACK HIGH VOLTAGE CIRCUIT FOR MEMORY

(71) Applicant: Taiwan Semiconductor Manufacturing Company, Ltd., Hsinchu (TW)

(72) Inventors: Perng-Fei Yuh, Walnut Creek, CA (US); Meng-Sheng Chang, Zhubei (TW); Tung-Cheng Chang, Xihu (TW); Yih Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/460,938

(22) Filed: Aug. 30, 2021

(65) Prior Publication Data

US 2023/0066618 A1    Mar. 2, 2023

(51) Int. Cl.
  *G11C 11/00* (2006.01)
  *G11C 5/14* (2006.01)
  *G11C 7/10* (2006.01)
  *G11C 17/18* (2006.01)
  *G11C 17/16* (2006.01)

(52) U.S. Cl.
  CPC ............ *G11C 5/147* (2013.01); *G11C 7/1084* (2013.01); *G11C 17/165* (2013.01); *G11C 17/18* (2013.01)

(58) Field of Classification Search
  CPC .................................................. G11C 17/165
  USPC ........................................................ 365/148
  See application file for complete search history.

(56) References Cited

U.S. PATENT DOCUMENTS

| 7,755,923 | B2 | 7/2010 | Liu et al. | |
|---|---|---|---|---|
| 10,050,629 | B1 | 8/2018 | Asnaashari et al. | |
| 2002/0172073 | A1* | 11/2002 | Hidaka | G11C 11/1659 365/158 |
| 2011/0188281 | A1 | 8/2011 | Siau et al. | |
| 2012/0320659 | A1* | 12/2012 | Kitagawa | G11C 13/0069 365/148 |
| 2022/0101934 | A1* | 3/2022 | Sanjeevarao | G11C 8/08 |

OTHER PUBLICATIONS

Taiwan Office Action issued in connection with TW Appl. Ser. No. 111107411 dated Dec. 8, 2022 (without English translation).

\* cited by examiner

*Primary Examiner* — Hoai V Ho
(74) *Attorney, Agent, or Firm* — Foley & Lardner LLP

(57) ABSTRACT

One aspect of this description relates to a memory array. The memory array includes a plurality of N-stack pass gates, a plurality of enable lines, a plurality of NMOS stacks, a plurality of word lines, and a matrix of resistive elements. Each N-stack pass gate includes a stage-1 PMOS core device and a stage-N PMOS core device in series. Each stage-1 PMOS is coupled to a voltage supply. Each enable line drives a stack pass gate. Each N-stack selector includes a plurality of NMOS stacks. Each NMOS stack includes a stage-1 NMOS core device and a stage-N N MOS core device in series. Each stage-1 NMOS core device is coupled to a ground rail. Each word line is driving a stack selector. Each resistive element is coupled between a stack pass gate and a stack selector. Each voltage supply is greater than a breakdown voltage for each of the core devices.

6 Claims, 25 Drawing Sheets

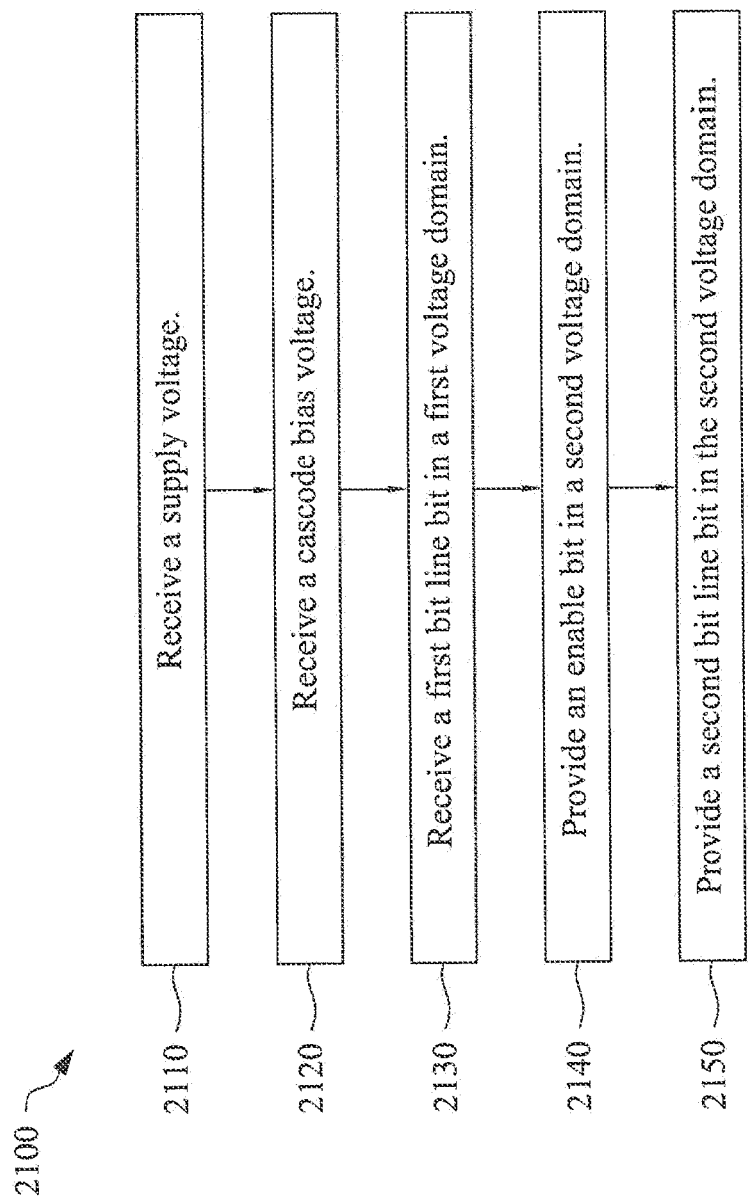

MULTIPLE STACK HIGH VOLTAGE CIRCUIT FOR MEMORY

BACKGROUND

Memory circuits including eFuse, anti-fuse, and some emerging memories usually require high voltage to program the memory cells. The memory peripheral circuits and arrays are under voltage stress during programming.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 21 is a flowchart showing a method of configuring a memory array, in accordance with some embodiments.

DETAILED DESCRIPTION

Figure 1:
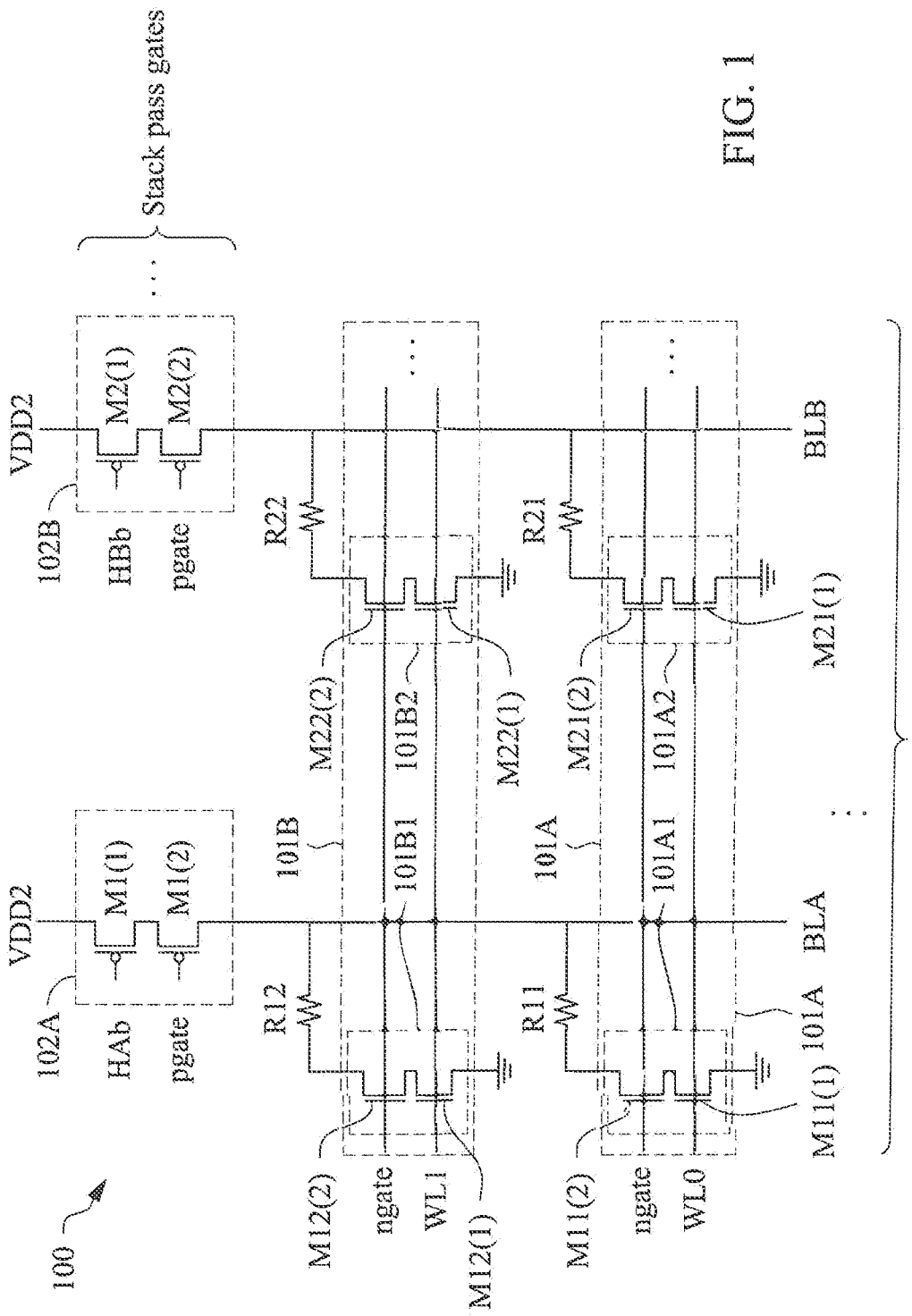
FIG. 1 is an example circuit diagram of a memory array, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

I/O (input/output) devices are traditionally used for high voltage circuitry, including eFuse and anti-fuse memory circuits, power switches, level shifters, and bias circuits for biasing high voltage circuitry. Core devices, with their smaller channel length and gate oxide thicknesses, consume a smaller chip area than I/O devices and have faster switching times than I/O devices. Moreover, I/O devices are being phased out for more recent fabrication process nodes (e.g., advanced nodes such as N2 or N3). However, core devices have a reliability concern. That is, core devices have a lower breakdown voltage which can cause them to fail under high voltage stress (e.g., across drain-source or gate-source) that is created by operation of high voltage circuitry.

Disclosed herein are embodiments of high voltage (HV) circuitry that includes core device stacks such that the individual core devices can withstand the stress associated with the higher voltage supply. For example, a double or triple stack memory array enables the programming voltage to two or three times the core device breakdown voltages, respectively, without voltage stress induced device failures. Moreover, a double or triple stack power switch circuit enables operation at constant high programming voltage without voltage stress induced device failures. Further disclosed are embodiments of level shifting for stack circuit control, as well as embodiments of a fractional voltage generator to provide biases for stacked circuits. Advantages include enabling advanced nodes for HV memory and analog applications without use of I/O devices, thereby reducing area and increasing speed of such HV circuitry.

FIG. 1 is an example circuit diagram of a memory array 100, in accordance with some embodiments. The memory array 100 includes a plurality of stack selectors 101A, 101B, . . . , 101N. Each stack selector includes a plurality of NMOS stacks (e.g., cascode, cascade, devices in series, etc.). For example, the stack selector 101A includes NMOS stacks 101A1, 101A2, . . . , 101AN, and the stack selector 101B includes NMOS stacks 101B1, 101B2, . . . , 101BN. Each NMOS stack includes a first NMOS core device in series with a second NMOS core device. For example, the NMOS stack 101A1 includes first and second NMOS core devices M11(1) and M11(2), the NMOS stack 101A2 includes first and second NMOS core devices M21(1) and M21(2), the NMOS stack 101B1 includes first and second NMOS core devices M12(1) and M12(2), and the NMOS stack 101B2 includes first and second NMOS core devices M22(1) and M22(2). A source of the first NMOS core device is coupled to ground rail and a drain of the first NMOS core device is coupled to a source of the second NMOS core device.

The memory array 100 includes a plurality of word lines WL0, WL1, . . . , WLN. Each of the word lines couples to the first NMOS core devices of a corresponding stack selector. For example, WL0 drives the gates of NMOS core devices M11(1) and M21(1), and WL1 drives the gates of NMOS core devices M12(1) and M22(1).

The memory array 100 includes an ngate bias line. The ngate bias line couples to the second NMOS core devices. For example, the ngate bias line drives the gates of NMOS core devices M11(2), M21(2), M12(2), and M22(2) with an ngate bit at a voltage level. In some embodiments, the ngate bias line drives the second NMOS core devices with a signal/bit at a voltage level of an overdrive voltage ($V_{od}$) greater than the voltage level of the bit with which the word line drives the first NMOS core devices (e.g., when the word line is enabling the corresponding first NMOS core device). A core device's $V_{od}$ is the minimum drain-source voltage ($V_{ds}$) for the core device to operate in saturation (e.g., the device's gate-source voltage, $V_{gs}$, less than the device's threshold voltage, $V_{th}$).

The memory array 100 includes a plurality of stack pass gates 102A, 102B, . . . , 102N. Each stack pass gate includes a first PMOS core device in series with a second PMOS core device. For example, the stack pass gate 102A includes first and second PMOS core devices M1(1) and M1(2), and the stack pass gate 102B includes first and second PMOS core devices M2(1) and M2(2). A source of the first PMOS core device is coupled to a voltage supply VDD2 and a drain of the first PMOS core device is coupled to a source of the second NMOS core device. The voltage supply VDD2 is a signal at a voltage level that is greater than the voltage level of the nominal voltage supply, VDD (e.g., voltage level VDD2 is twice of the voltage level VDD). The nominal voltage supply, VDD, may be used to power on single/non-stacked core devices. Thus, the memory array 100 is high voltage circuitry.

The memory array 100 includes a plurality of enable lines HAb, HBb, . . . , HNb. Each of the enable lines couples to a corresponding first PMOS core device. For example, HAb drives the gate of PMOS core device M1(1) and HBb drives the gate of PMOS core device M2(1).

The memory array 100 includes a pgate bias line. The pgate bias line couples to the second PMOS core devices with pgate bit at a voltage level. For example, the pgate bias line drives the gates of PMOS core devices M1(2) and M2(2). In some embodiments, the pgate bias line drives the second NMOS core devices with a signal at a voltage level of $V_{od}$ less than the voltage level of the bit with which the enable line drives the first PMOS core device (e.g., when the enable line is enabling the corresponding first PMOS core device).

The memory array includes a matrix of resistive elements (e.g., resistors) that are arranged in two dimensions (e.g., rows and columns). Each first dimension (e.g., row) has a same number of resistive elements as there are stack pass gates. Each second dimension (e.g., column) has a same number of resistive elements as there are stack selectors. Each resistive element is coupled on one side to the stack selector and on the other side to the stack pass gate. More specifically, each resistive element is coupled on one side to a drain of the second NMOS core device and on the other side to a drain of the second PMOS core device. For example, resistive element R11 is coupled between the source of M11(2) and the source of M1(2), resistive element R12 is coupled between the source of M12(2) and the source of M1(2), resistive element R21 is coupled between the source of M21(2) and the source of M2(2), resistive element R22 is coupled between the source of M22(2) and the source of M2(2).

The memory array 100 includes a plurality of bit lines BLA, BLB, . . . , BLN. Each bit line is coupled to a stack pass gate and a corresponding column of resistive elements. Note that the plurality of bit lines can be driven by an output of a power switch (e.g., the power switch 500 of FIG. 5) or an output of a level shift circuit (e.g., the level shift circuit 900 of FIG. 9).

The resistive elements of the memory array 100 are initially in a first state (e.g., low resistance). In response to enabling a stack selector by driving it with a bit at a first voltage level (e.g., VDD), enabling a stack pass gate by driving it with a bit at a second voltage level (e.g., VDD), and, in some embodiments, asserting a bit with a high voltage level (e.g., VDD2) on the corresponding bit line, the memory array 100 generates a voltage drop across a resistive element coupled between the stack selector and the stack pass gate, causing the resistive element to change to a second state (e.g., high resistance). This is referred to as programming the memory array and/or burning the fuse.

As described above, the voltage supply VDD2 can carry a signal at a voltage level that is twice the voltage level of the nominal voltage supply, VDD. Each of the core devices in the memory array 100 have a breakdown voltage (e.g., voltage applied across its drain-source terminal that causes the device to fail/breakdown) that is less than the voltage level of VDD2. In some embodiments, each of the core devices in the memory array 100 have a breakdown voltage that is greater than the voltage level of VDD. Thus, by arranging the core devices in accordance with the memory array 100, high voltage circuitry can be operated without causing the core devices to fail.

Figure 2:
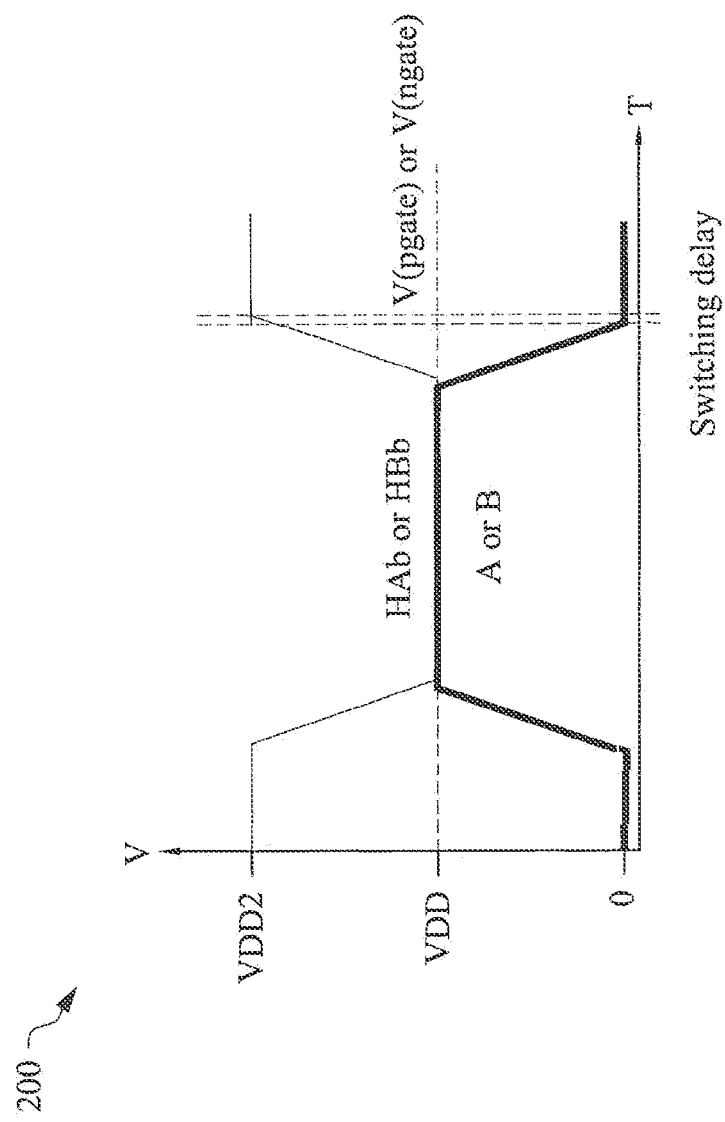
FIG. 2 is an example timing diagram of the memory array, in accordance with some embodiments.

FIG. 2 is an example timing diagram 200 of the memory array 100, in accordance with some embodiments. The timing diagram 200 shows voltage level on the y-axis versus timing of enable and bias bits/signals on the x-axis. A voltage level of the bit A is toggled (e.g., the voltage level changes from 0 to VDD or from VDD to 0) when the corresponding pass gate stack is selected or de-selected. The bit A is input into a level shift circuit (e.g., the level shift circuit 900 of FIG. 9). The level shift circuit outputs the HAb bit on the enable line HAb. In response to the bit A toggling from 0 to VDD, the voltage level of the bit HAb toggles from VDD2 to VDD. There is a switching delay between toggling of the bit A and the bit HAb. This switching delay is less for level shift circuits including core devices than for level shift circuits including I/O devices.

The ngate bit and the pgate bit are applied to the ngate bias line and the pgate bias line, respectively. The voltage level of the ngate bit and the pgate bit are at, or substantially near, the voltage level VDD.

Figure 3:
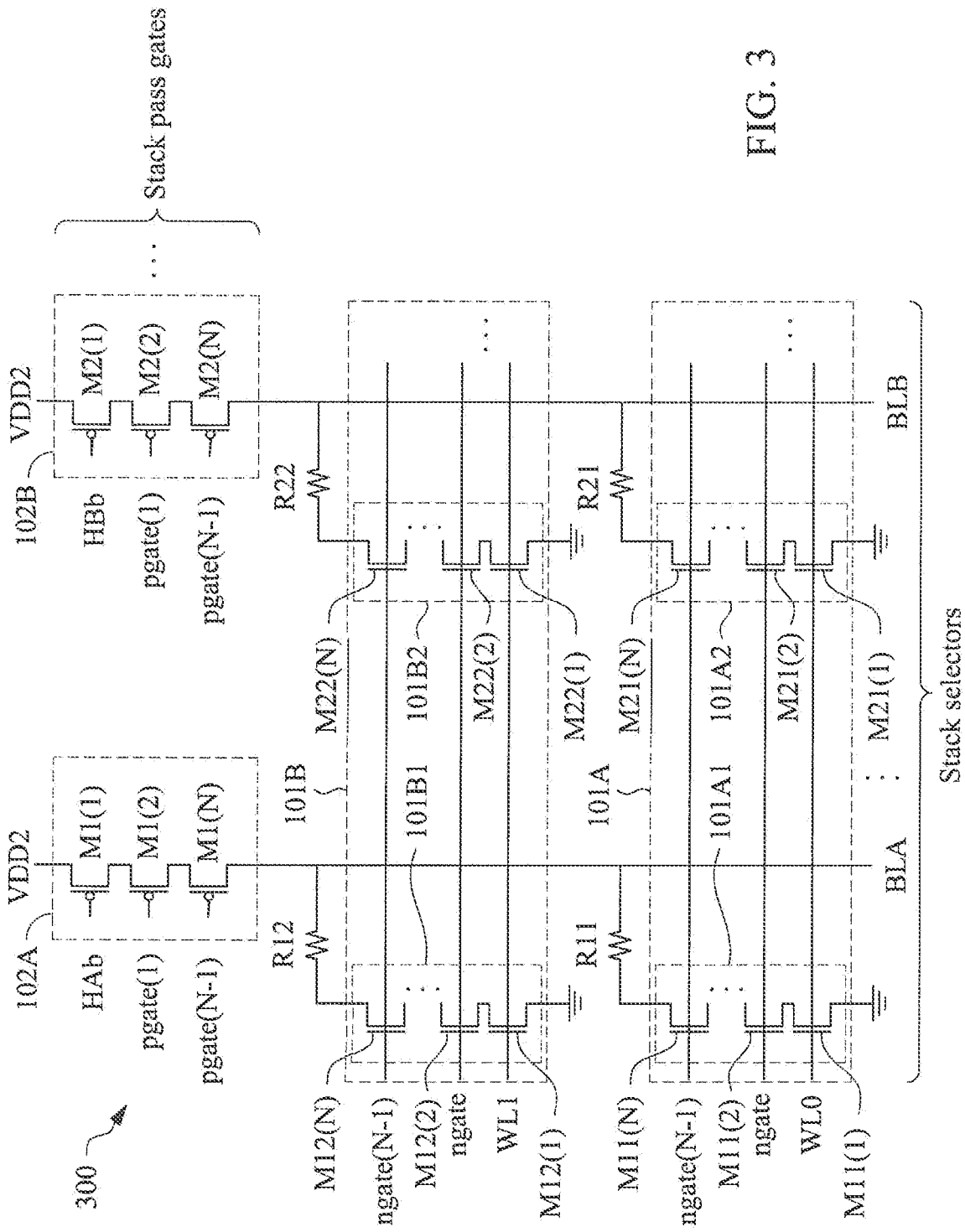
FIG. 3 is an example circuit diagram of a memory array, in accordance with some embodiments.

FIG. 3 is an example circuit diagram of a memory array 300, in accordance with some embodiments. The memory array 300 is similar to the memory array 100 except that each NMOS stack and each stack pass gate is an N-stack (e.g., a stack of N core devices in series), and the voltage supply is HVDD (e.g., N*VDD). As shown in FIG. 3, N can be any integer greater than 2. As shown in FIG. 1, N can be 2. For example, the NMOS stack 101A1 includes the core devices M11(1), M11(2), . . . , M11(N), the NMOS stack 101A2 includes the core devices M21(1), M21(2), . . . , M21(N), the NMOS stack 101B1 includes the core devices M12(1), M12(2), . . . , M12(N), the NMOS stack 101B2 includes the core devices M22(1), M22(2), . . . , M22(N), the stack pass gate 102A includes the core devices M1(1), M1(2), . . . , M1(N), and the stack pass gate 102B includes the core devices M2(1), M2(2), . . . , M2(N).

The memory array 300 includes N−1 ngate bias lines and N−1 pgate bias lines. Each of the ngate bias lines couple to corresponding NMOS core devices. For example, the ngate (1) bias line drives the gates of NMOS core devices M11(2), M21(2), M12(2), and M22(2) and the ngate(N−1) bias line drives the gates of NMOS core devices M11(N), M21(N), M12(N), and M22(N). Each pgate bias line couples to the corresponding PMOS core devices. For example, the pgate (1) bias line drives the gates of PMOS core devices M1(2) and M2(2) and the pgate(N−1) bias line drives the gates of PMOS core devices M1(N) and M2(N).

Note that, as shown in FIG. 3, the resistive element R11 is coupled between the source of M11(N) and the source of M1(N), the resistive element R12 is coupled between the source of M12(N) and the source of M1(N), the resistive element R21 is coupled between the source of M21(N) and the source of M2(N), the resistive element R22 is coupled between the source of M22(N) and the source of M2(N).

Figure 4:
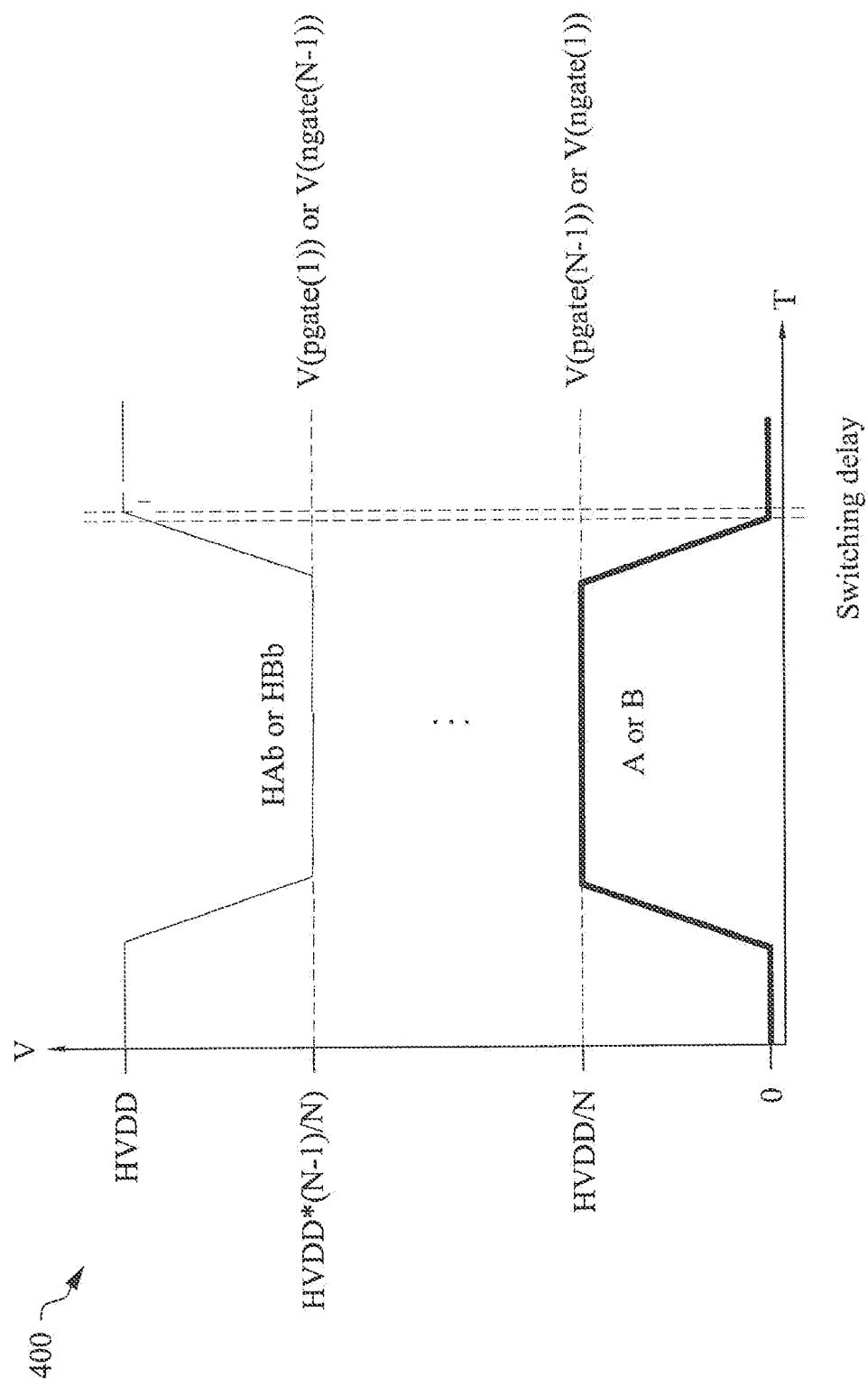
FIG. 4 is an example timing diagram of the memory array, in accordance with some embodiments.

FIG. 4 is an example timing diagram 400 of the memory array 300, in accordance with some embodiments. The timing diagram 400 shows voltage level on the y-axis versus timing of enable and bias bits/signals on the x-axis. In response to voltage level of the bit A toggling from 0 to VDD, the voltage level of the bit HAb toggles from HVDD to HVDD*(N−1)/N. The ngate bits and the pgate bits are applied to the ngate bias lines and the pgate bias lines, respectively. The voltage level of the ngate(1) bit and the pgate(N−1) bit are at, or substantially near, HVDD/N (e.g., VDD). The voltage level of the ngate(N−1) bit and the pgate(1) bit are at, or substantially near, HVDD*(N−1)/N.

Figure 5:
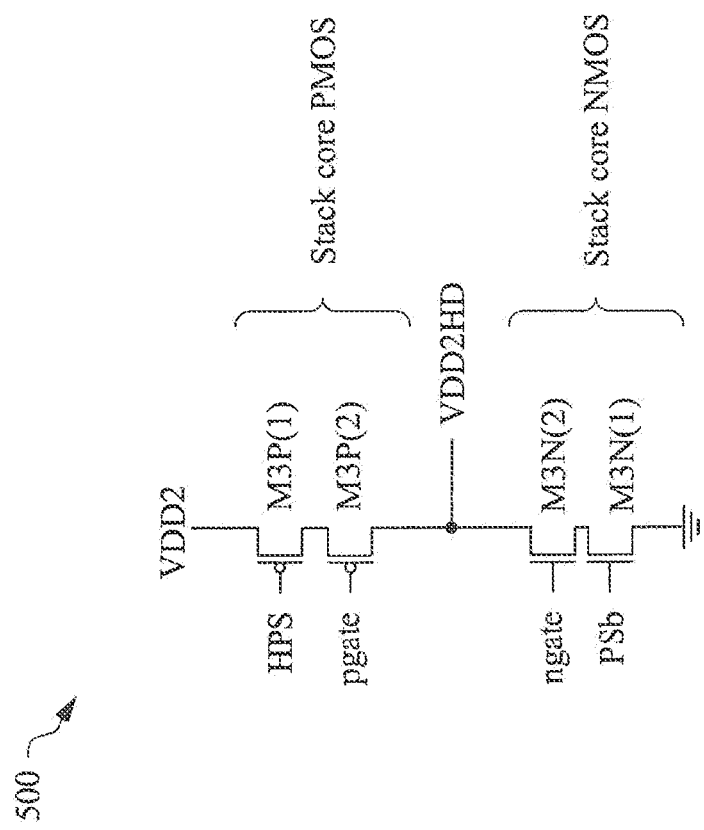
FIG. 5 is an example circuit diagram of a power switch, in accordance with some embodiments.

FIG. 5 is an example circuit diagram of a power switch 500, in accordance with some embodiments. The power switch 500 includes a stack core NMOS for pulling down an output VDD2HD of the power switch 500. The stack core NMOS includes the NMOS core device M3N(1) in series with the NMOS core device M3N(2). Specifically, a drain of M3N(1) is coupled to a source of M3N(2). A source of M3N(1) is coupled to ground and a drain of M3N(2) is coupled to the output line VDD2HD.

The power switch 500 includes a stack core PMOS for pulling up the output VDD2HD. The stack core PMOS includes the PMOS core device M3P(1) in series with the PMOS core device M3P(2). Specifically, a drain of M3P(1) is coupled to a source of M3P(2). A source of M3P(1) is coupled to VDD2 and a drain of M3P(2) is coupled to the output line VDD2HD. Thus, the output line VDD2HD is coupled to the NMOS core stack and the PMOS core stack.

The power switch 500 includes an enable line PSb that drives a gate of the NMOS core device M3N(1) and an enable line HPS that drives a gate of the PMOS core device M3P(1). To pull down the output VDD2HD, a high voltage level should be applied at PSb and HPS (e.g., VDD and VDD2, respectively). To pull up the output VDD2HD, a low voltage level should be applied at PSb and HPS (e.g., 0 and VDD, respectively).

The power switch 500 includes an ngate bias line that drives the gate of M3N(2). In some embodiments, the ngate bias line drives M3N(2) with a signal at a voltage level of $V_{od}$ greater than the voltage level of the bit with which the enable line PSb drives M3N(1) (e.g., when the enable line PSb is enabling M3N(1)).

The power switch 500 includes a pgate bias line that drives the gate of M3P(2). In some embodiments, the pgate bias line drives M3P(2) with a signal at a voltage level of $V_{od}$ less than the voltage level of the bit with which the enable line HPSb drives M3P(1) (e.g., when the enable line HPSb is enabling M3P(1)).

Figure 6:
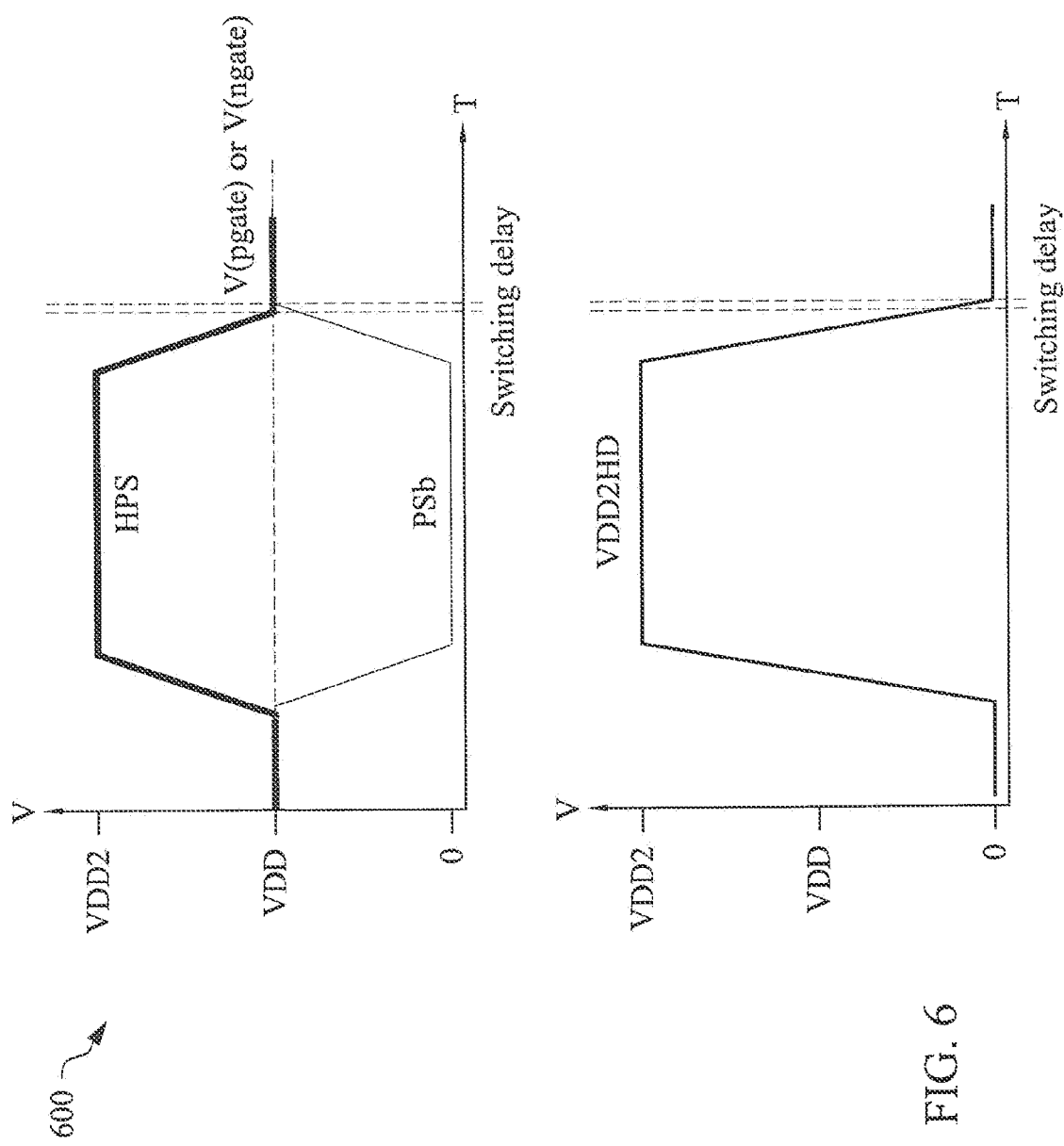
FIG. 6 is an example timing diagram of the power switch, in accordance with some embodiments.

FIG. 6 is an example timing diagram 600 of the power switch 500, in accordance with some embodiments. A voltage level of the bit PSb is toggled (e.g., the voltage level changes from 0 to VDD or from VDD to 0) when the corresponding pass gate stack is selected or de-selected. The bit PSb is input into a level shift circuit (e.g., the level shift circuit 900 of FIG. 9). The level shift circuit outputs the HPS bit on the enable line HPS. In response to a voltage level of the bit PSb toggling from VDD to 0, the voltage level of the bit HPS toggles from VDD to VDD2. The switching delay between toggling of the voltage level of the bit PSb and the voltage level of the bit HPS is less for level shift circuits including core devices than for level shift circuits including I/O devices. In response to the bit PSb toggling from VDD to 0, the voltage level of the bit VDD2HD on the output line toggles from 0 to VDD2.

Figure 7:
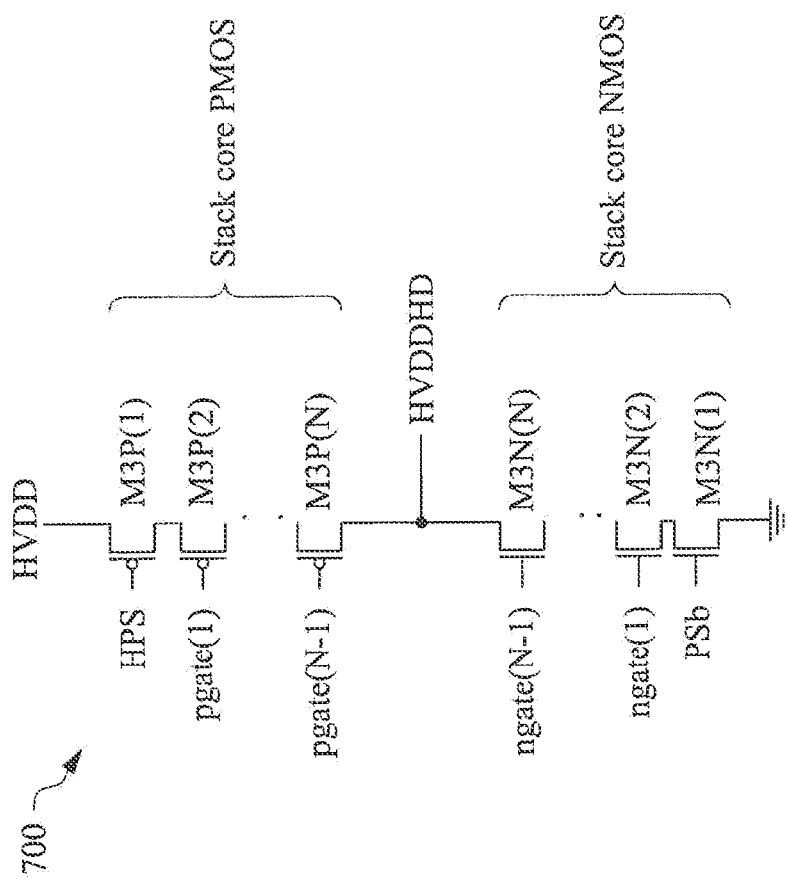
FIG. 7 is an example circuit diagram of a power switch, in accordance with some embodiments.

FIG. 7 is an example circuit diagram of a power switch 700, in accordance with some embodiments. The power switch 700 is similar to the power switch 500 except that the stack core NMOS is an N-stack, the stack core PMOS is an N-stack, and the voltage supply is HVDD (e.g., N*VDD). Each stack core includes N core devices. For example, the stack core NMOS includes NMOS core devices M3N(1), M3N(2), . . . , M3N(N) in series, and the stack core PMOS includes NMOS core devices M3P(1), M3P(2), . . . , M3P(N) in series.

The power switch 700 includes N−1 ngate bias lines and N−1 pgate bias lines. Each of the ngate bias lines couple to corresponding NMOS core devices. For example, there are ngate(1) bias line that drives M3N(2), ngate(N−1) bias line that drives M3N(N), pgate(1) bias line that drives M3P(2), pgate(N−1) bias line that drives M3P(N). Note that the output line HVDDHD is coupled to the source of M3N(N) and the source of M3P(N).

Figure 8:
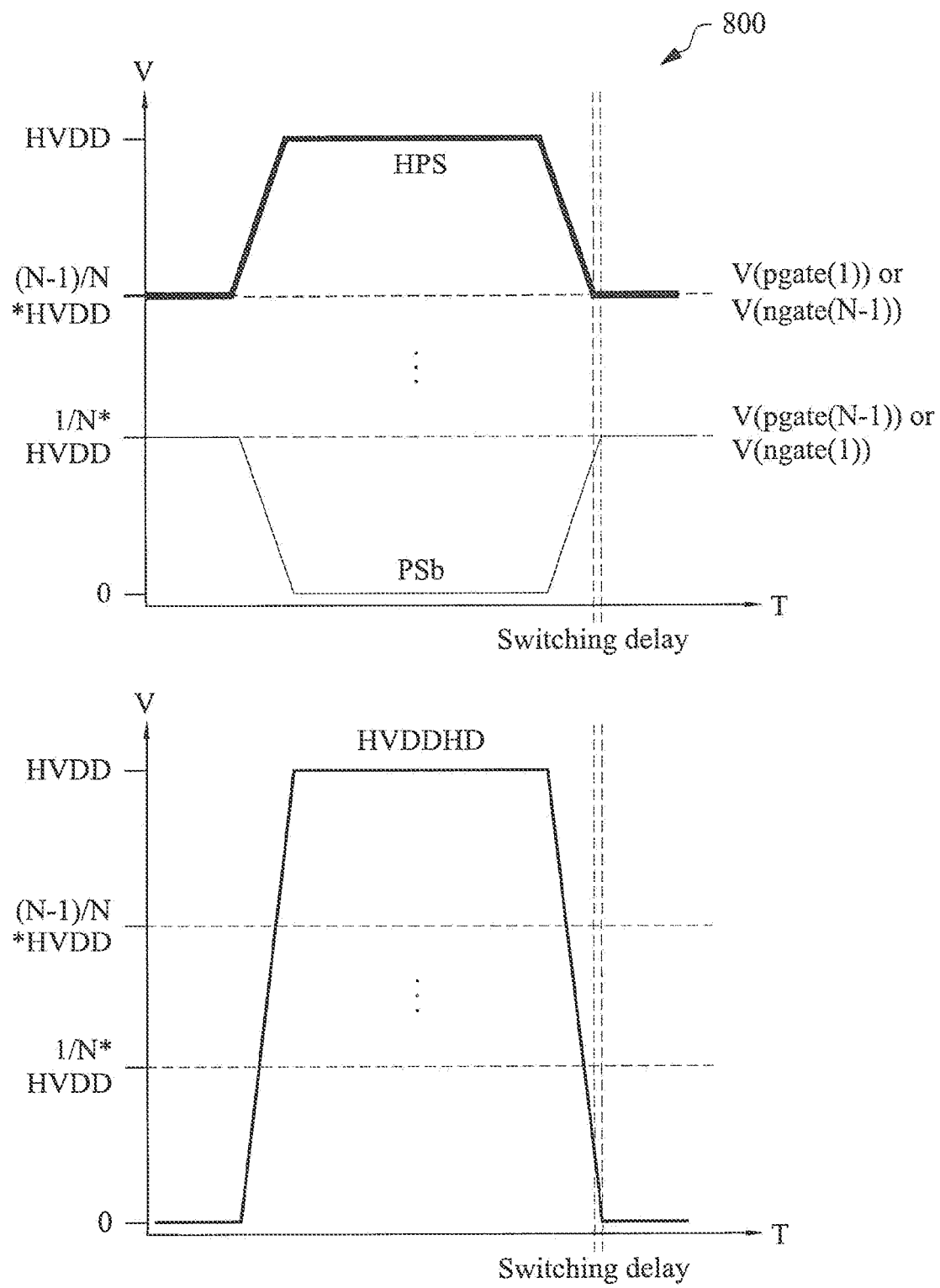
FIG. 8 is an example timing diagram of the power switch, in accordance with some embodiments.

FIG. 8 is an example timing diagram 800 of the power switch 700, in accordance with some embodiments. In response to a voltage level of the bit PSb toggling from VDD to 0, the voltage level of the bit HPS toggles from HVDD*(N−1)/N to HVDD. The ngate bits and the pgate bits are applied to the ngate bias lines and the pgate bias lines, respectively. The voltage level of the ngate(1) bit and the pgate(1) bit are at, or substantially near, HVDD/N (e.g., VDD). The voltage level of the ngate(N−1) bit and the pgate(N−1) bit are at, or substantially near, HVDD*(N−1)/N. In response to a voltage level of the bit PSb toggling from VDD to 0, the voltage level of the bit HVDDHD on the output line toggles from 0 to HVDD.

Figure 9:
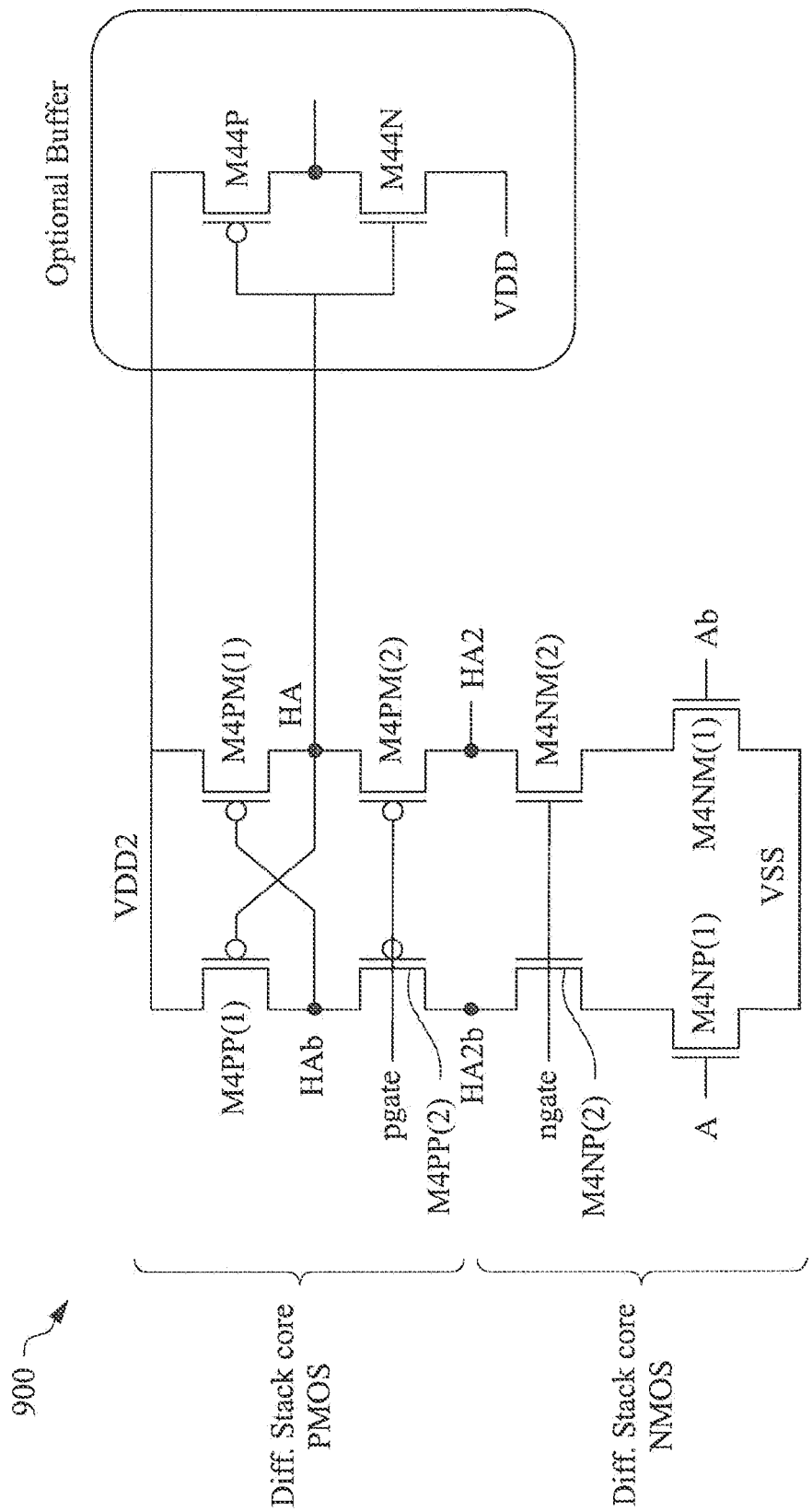
FIG. 9 is an example circuit diagram of a level shift circuit, in accordance with some embodiments.

FIG. 9 is an example circuit diagram of a level shift circuit 900, in accordance with some embodiments. The level shift circuit 900 includes a stack core NMOS. The differential stack core NMOS includes a differential pair of NMOS core devices M4NP(1) and M4NM(1). The sources of M4NP(1) and M4NM(1) are coupled to VSS (e.g., ground rail). The differential stack core NMOS includes a differential pair of NMOS core devices M4NP(2) and M4NM(2) in series with M4NP(1) and M4NM(1), respectively. Specifically, the source of M4NP(2) is coupled to the drain of M4NP(1) and the source of M4NM(2) is coupled to the drain of M4NM(1). The drains of M4NP(2) and M4NM(2) are coupled to the differential output line HA2b and HA2, respectively.

The level shift circuit 900 includes differential stack core PMOS. The differential stack core PMOS includes a differential pair of PMOS core devices M4PP(1) and M4PM(1). The sources of M4PP(1) and M4PM(1) are coupled to VDD2. The core devices M4PP(1) and M4PM(1) are cross-coupled. Specifically, the gate of M4PP(1) is coupled to the drain of M4PM(1) and the drain of M4PP(1) is coupled to the gate of M4PM(1). The drains of M4PP(1) and M4PM(1) are coupled to the differential output line HAb and HA, respectively. The differential stack core PMOS includes a differential pair of PMOS core devices M4PP(2) and M4PM(2) in series with M4PP(1) and M4PM(1). Specifically, the source of M4PP(2) is coupled to the drain of M4PP(1) and the source of M4PM(2) is coupled to the drain of M4PM(1). The drain of M4PP(2) and M4PM(2) are coupled to the differential output line HA2b and HA2, respectively.

The level shift circuit 900 includes an differential input line, A and Ab, that drives a gate of the NMOS core devices M4NP(1) and M4NM(1), respectively. If N level shift circuits 900 are used, the differential input lines (and bits thereon) can be referred to as A and Ab, B and Bb, ... N and Nb.

The level shift circuit 900 includes a ngate bias line that drives the gates of M4NP(2) and M4NM(2). In some embodiments, the ngate bias line drives M4NP(2) and M4NM(2) with a signal at a voltage level of $V_{od}$ greater than the voltage level of the bit with which the input line A drives M4NP(1), if bit A is at a high voltage (e.g., VDD), or the voltage level of the bit with which the input line Ab drives M4NM(1), if bit Ab is a at a high voltage.

The level shift circuit 900 includes a pgate bias line that drives the gates of M4PP(2) and M4PM(2). In some embodiments, the pgate bias line drives M4PP(2) and M4PM(2) with a signal at a voltage level of $V_{od}$ less than the voltage level of the HA bit with which the drain of M4PM(1) drives M4PP(1), if the HA bit is at a low voltage (e.g., VDD), or the voltage level of the HAb bit with which the drain of M4PP(1) drives M4PM(1), if the HAb bit is at a low voltage.

In some embodiments, the level shift circuit 900 includes an optional buffer that buffers/inverts the bit of the output line HA. The optional buffer includes core devices M44N and M44P. The gates of M44N and M44P are coupled to the output line HA. The drains of M44N and M44P are coupled to a buffered output line. The sources of M44N and M44P are coupled to VDD and VDD2, respectively. A similar optional buffer can buffer the bit of the output line HAb.

Figure 10:
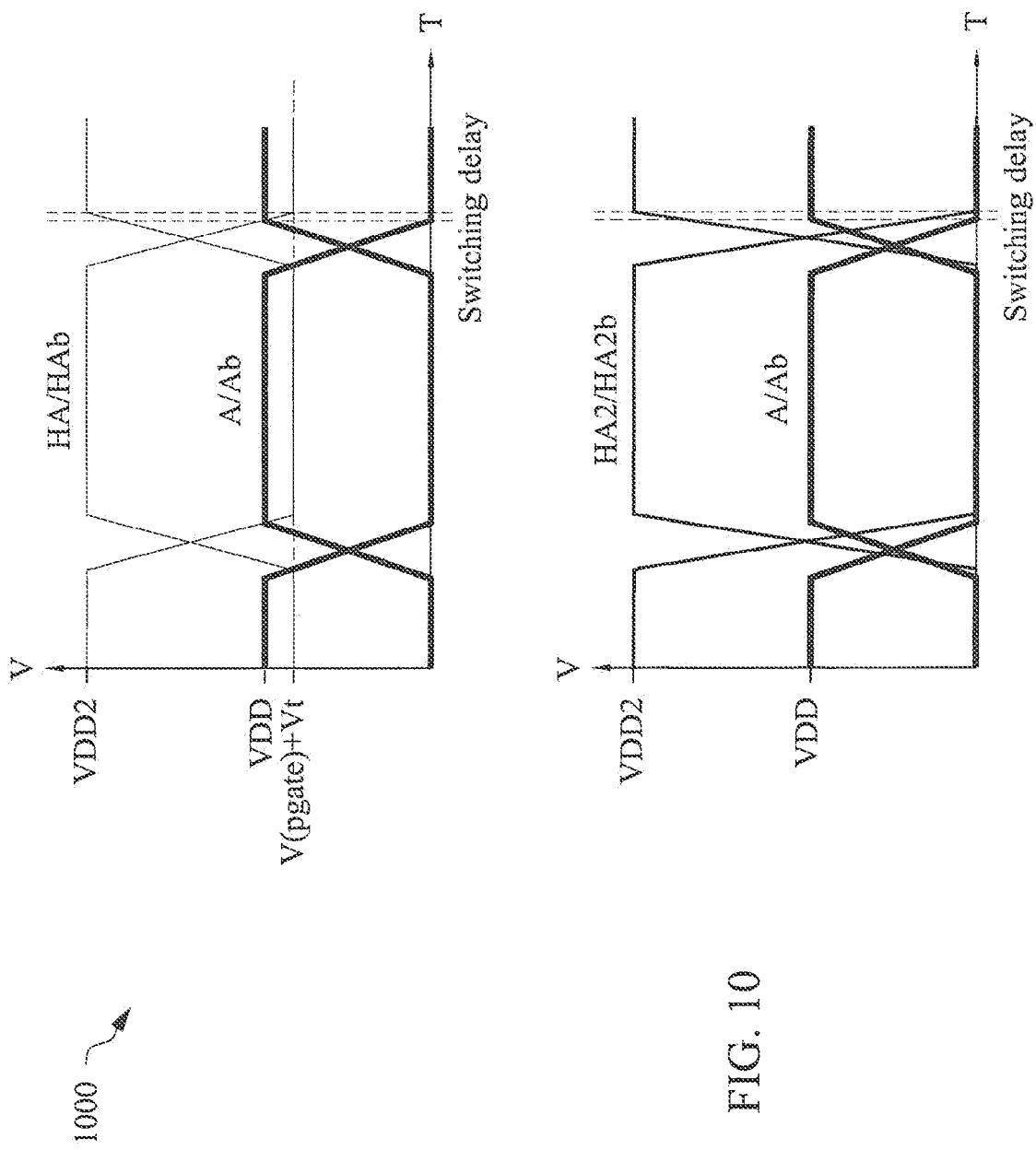
FIG. 10 is an example timing diagram of the level shift circuit, in accordance with some embodiments.

FIG. 10 is an example timing diagram 1000 of the level shift circuit 900, in accordance with some embodiments. In response to a voltage level of the input bit A (or Ab) toggling from 0 to VDD, the voltage levels of the output bits HA and HA2 (or HAb and HA2b) toggle from VDD to VDD2 and from 0 to VDD2, respectively. In response to a voltage level of the input bit A (or Ab) toggling from VDD to 0, the voltage levels of the output bits HA and HA2 (or HAb and HA2b) toggle from VDD2 to VDD and from VDD2 to 0, respectively. The switching delay between toggling of the bit A and the bits HA and HA2 is less for level shift circuits including core devices than for level shift circuits including I/O devices.

Figure 11:
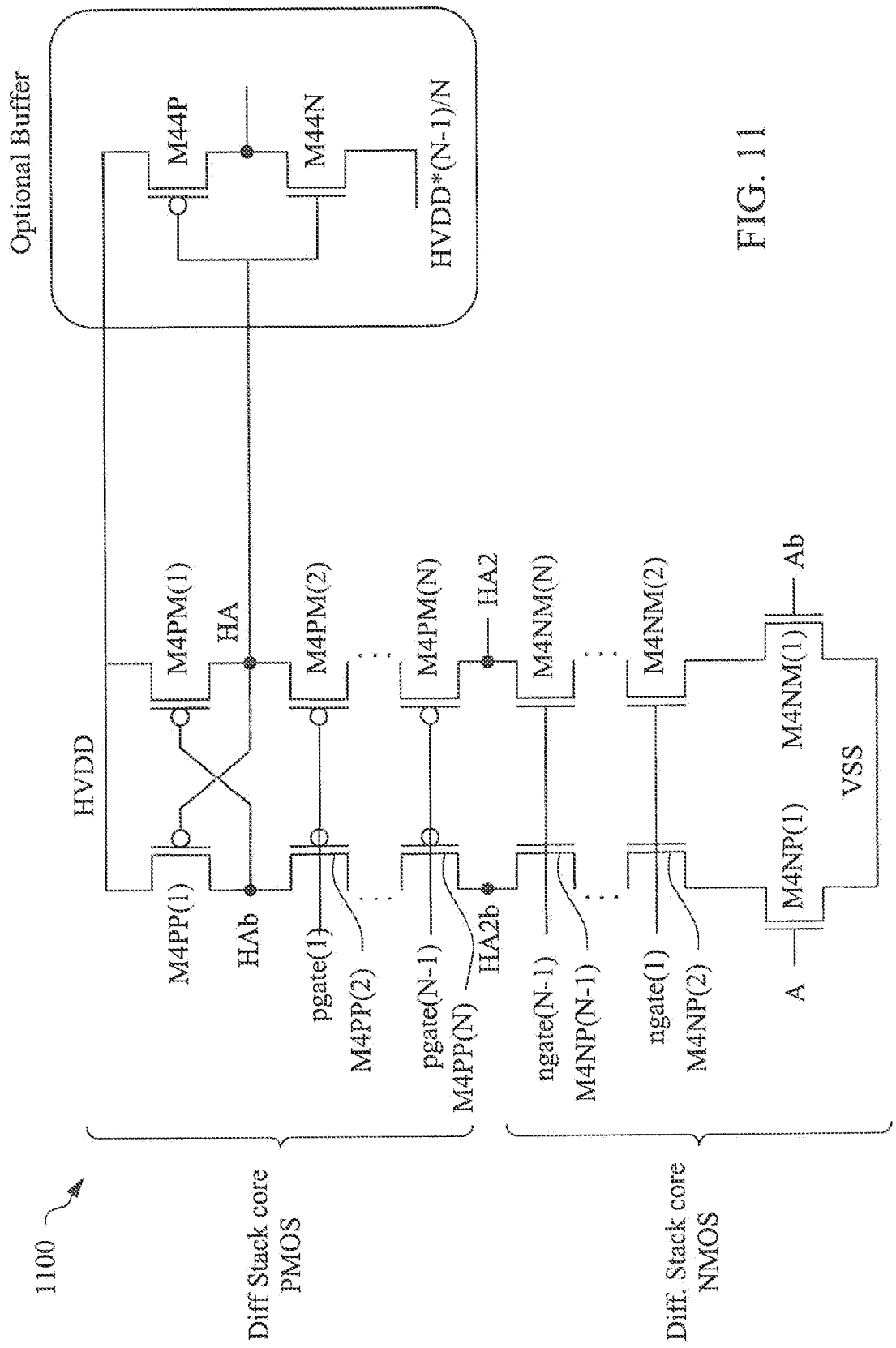
FIG. 11 is an example circuit diagram of a level shift circuit, in accordance with some embodiments.

FIG. 11 is an example circuit diagram of a level shift circuit 1100, in accordance with some embodiments. The level shift circuit 1100 is similar to the level shift circuit 900 except that the differential stack core NMOS, is an N-stack, the differential stack core PMOS is an N-stack, and the voltage supply is HVDD (e.g., N*VDD). Each differential stack core includes N differential pairs of core devices in series, which can be described as two stacks of N core devices in series. For example, the stack core NMOS includes M4NP(1), M4NP(2), ..., M4NP(N) in series and M4NM(1), M4NM(2), ..., M4NM(N) in series and the stack core PMOS includes M4PP(1), M4PP(2), ..., M4PP(N) in series and M4PM(1), M4PM(2), ..., M4PM(N) in series.

The level shift circuit 1100 includes N−1 ngate bias lines and N−1 pgate bias lines. Each of the ngate bias lines couple to corresponding NMOS core devices. For example, there are ngate(1) bias line that drives M4NP(2) and M4NM(2), ngate(N−1) bias line that drives M4NP(N) and M4NM(N), pgate(1) bias line that drives M4PP(2) and M4PM(2), pgate(N−1) bias line that drives M4PP(N) and M4PM(N). Note that the output line HA2 is coupled to the source of M4NM(N) and the source of M4PM(N) and the output line HA2b is coupled to the source of M4NP(N) and the source of M4PP(N).

Figure 12:
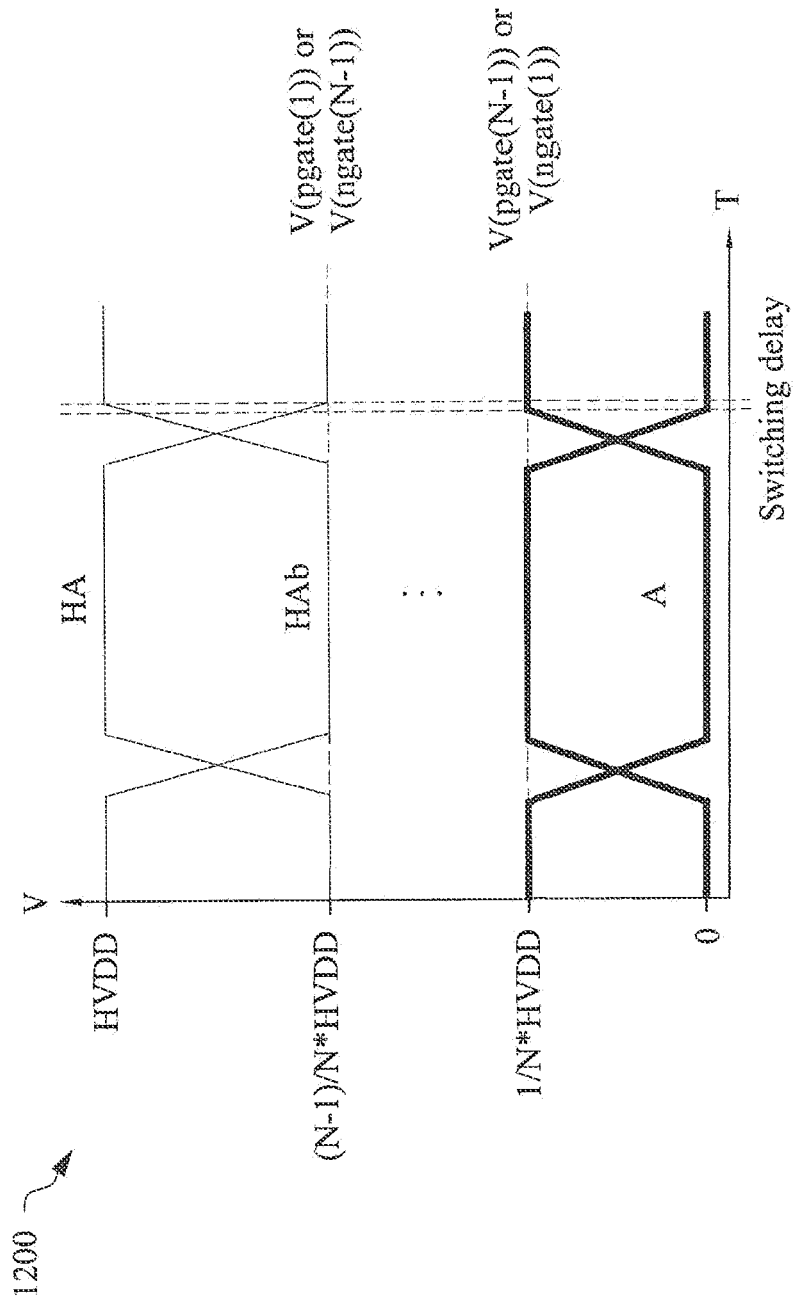
FIG. 12 is an example timing diagram of the level shift circuit, in accordance with some embodiments.

FIG. 12 is an example timing diagram 1200 of the level shift circuit 1100, in accordance with some embodiments. In response to a voltage level of the bit A toggling from 0 to VDD, the voltage level of the bit HA toggles from HVDD*(N−1)/N to HVDD and the voltage level of the bit HAb toggles from HVDD to HVDD*(N−1)/N. In response to a voltage level of the bit A toggling from VDD to 0, the voltage level of the bit HA toggles from HVDD to HVDD*(N−1)/N and the voltage level of the bit HAb toggles from HVDD*(N−1)/N to HVDD. The ngate bits and the pgate bits are applied to the ngate bias lines and the pgate bias lines, respectively. The voltage level of the ngate(1) bit and the pgate(N−1) bit are at, or substantially near, HVDD/N (e.g., VDD). The voltage level of the ngate(N−1) bit and the pgate(1) bit are at, or substantially near, HVDD*(N−1)/N. In response to a voltage level of the bit A toggling from 0 to VDD, the voltage level of the bit HA2 toggles from 0 to HVDD and the voltage level of the bit HA2b toggles from HVDD to 0. In response to a voltage level of the bit A toggling from VDD to 0, the voltage level of the bit HA2 toggles from HVDD to 0 and the voltage level of the bit HA2b toggles from 0 to HVDD.

Figure 13:
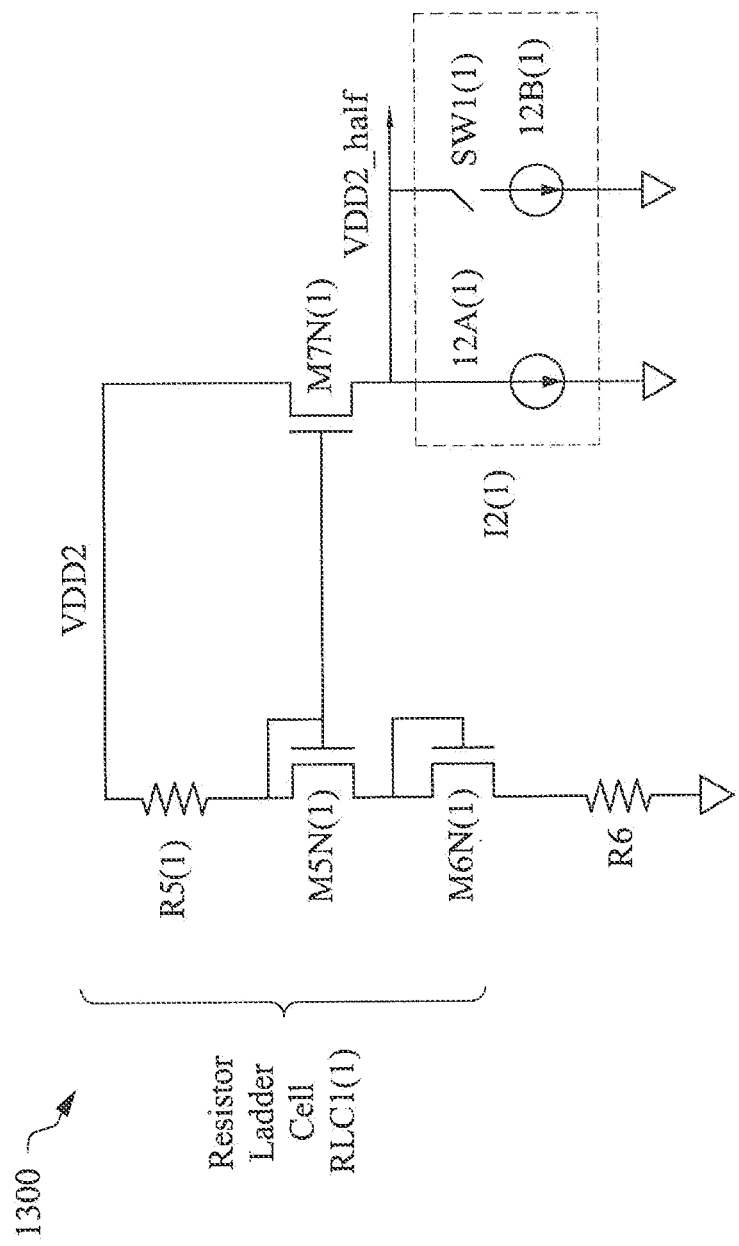
FIG. 13 is an example circuit diagram of a bias generation circuit, in accordance with some embodiments.

FIG. 13 is an example circuit diagram of a bias generation circuit 1300, in accordance with some embodiments. The bias generation circuit 1300 includes a resistor ladder cell RLC1(1). As shown in FIG. 13, RLC1(1) includes a resistive element R5(1), a diode-connected NMOS core device M5N(1) in series with R5(1), and a diode-connected NMOS core device M6N(1) in series with R5(1) and M5N(1). R5(1) is coupled to VDD2. The bias generation circuit 1300 includes a resistor R6 in series with RLC1(1). Specifically, R6 is coupled to the source of M6N(1). R6 is coupled to ground.

The bias generation circuit 1300 includes a source follower cell. The source follower cell includes a source follower M7N(1) driven by M5N(1). Specifically, the drain and gate of M5N(1) are coupled to the gate of M7N(1). The drain of M7N(1) is coupled to VDD2.

The source follower cell includes a tail current element I2(1) coupled to the source of M7N(1) and coupled to ground. As shown in FIG. 13, the tail current element I2(1) includes a current source I2A(1) representing a fixed portion of the tail current element I2(1) and, in parallel to I2A(1), a current source I2B(1) in series with a switch SW1(1), wherein I2B(1) and SW1(1) represent an adjustable portion of I2(1). The adjustable portion can be enabled to provide strong buffer capability. An output line VDD2_half is coupled to the source of M7N(1) and the tail current element I2(1). In some embodiments, during operation, the output line VDD2_half carries a signal at a voltage level that is half of VDD2 (e.g., VDD2/2=VDD).

In one embodiment, the current going through RLC1(1) is 10 uA, the resistive elements R5(1) and R6 are 150 k ohms, the current source I2A(1) generates 5 uA, the current source I2B(1) generates 100 uA and VDD2=1.5V.

Figure 14:
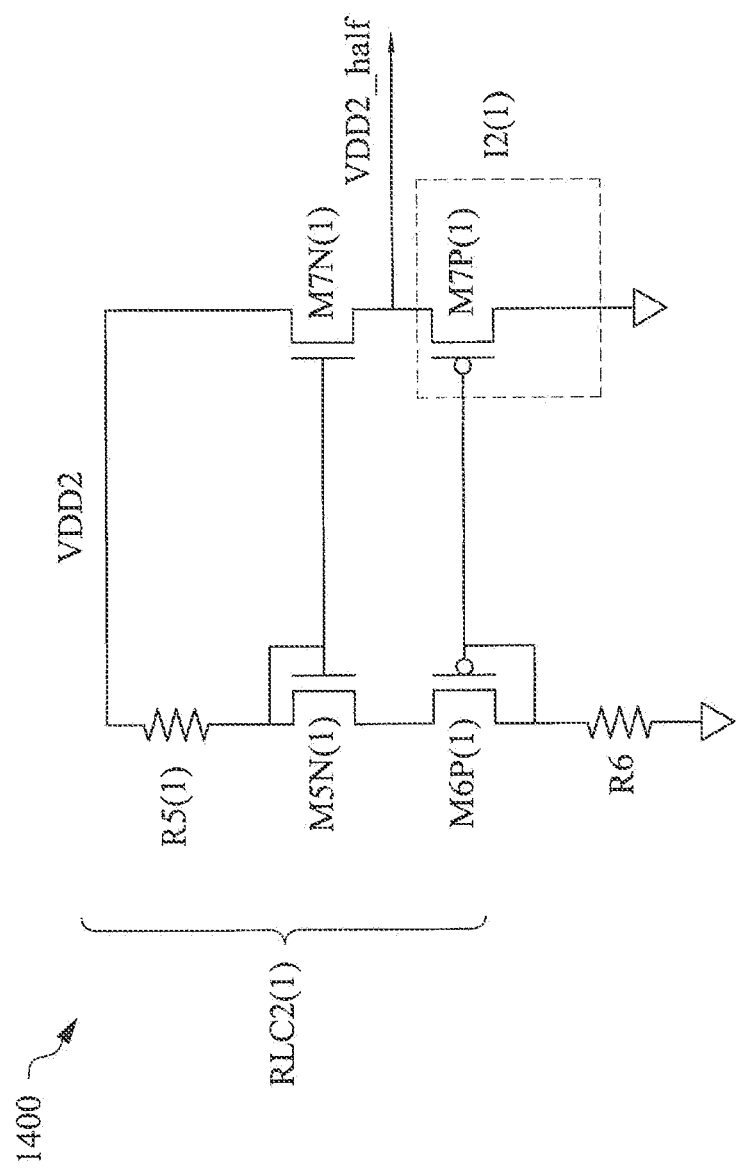
FIG. 14 is an example circuit diagram of a bias generation circuit, in accordance with some embodiments.

FIG. 14 is an example circuit diagram of a bias generation circuit 1400, in accordance with some embodiments. The bias generation circuit 1400 is similar to the bias generation circuit 1300 except that (a) the resistor ladder cell RLC2 of the bias generation circuit 1400 includes a diode connected PMOS core device M6P(1) (rather than an NMOS core device) in series with R5(1) and M5N(1) and (b) the tail current element I2(1) is shown to include a PMOS source follower M7P(1). A gate of M7P(1) is driven by the drain and gate of M6P(1) and a drain of M7P(1) is coupled to the drain of M7N(1). M7N(1) and M7P(1) are referred to as a class A/B source follower.

In one embodiment, the current going through RLC2 is 10 uA, the resistive elements R5(1) and R6 are 90 k ohms, M6P(1) is biased for 5 uA, and VDD2=1.5V.

Figure 15:
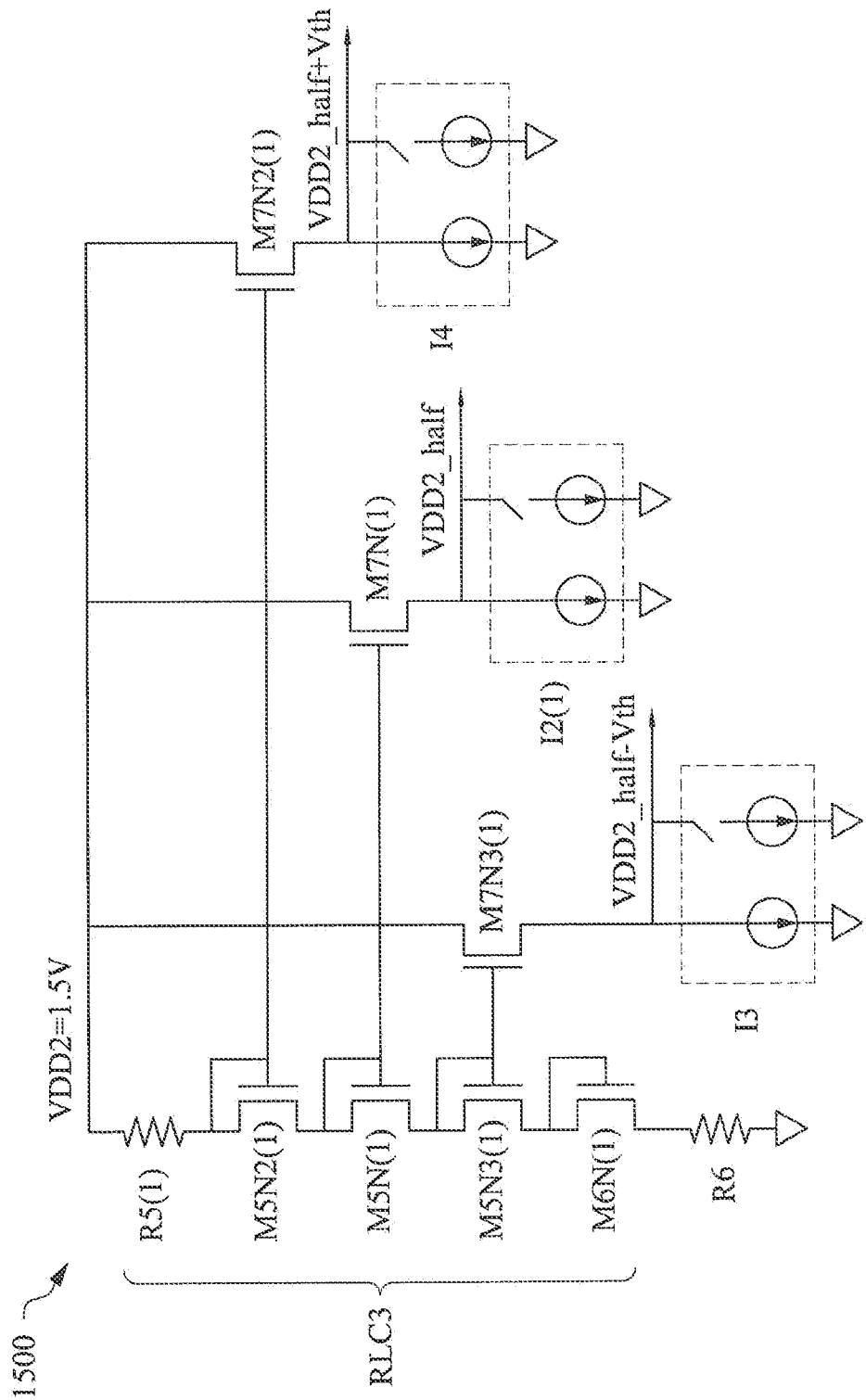
FIG. 15 is an example circuit diagram of a bias generation circuit, in accordance with some embodiments.

FIG. 15 is an example circuit diagram of a bias generation circuit 1500, in accordance with some embodiments. The bias generation circuit 1500 is similar to the bias generation circuit 1300 except that, for a voltage supply VDD2, it generates signals at more voltage levels than the VDD2/2 voltage level on the VDD2_half voltage line. The RLC3 of bias generation circuit 1500 includes diode connected NMOS core devices M5N2(1) and M5N3(1) in series with M5N(1), M6N(1), and R5(1).

The bias generation circuit 1500 includes a source follower M7N2(1) driven by M5N2(1). Specifically, the drain and gate of M5N2(1) are coupled to the gate of M7N2(1). The drain of M7N2(1) is coupled to VDD2. The bias generation circuit 1500 includes a tail current element I3 coupled to the source of M7N2(1) and coupled to ground. An output line VDD2_half+Vth is coupled to the source of M7N2(1) and the tail current element I3. In some embodiments, during operation, the output line VDD2_half+Vth carries a signal of a voltage level that is half of VDD2 plus an NMOS core device $V_{th}$.

The bias generation circuit 1500 includes a source follower M7N3(1) driven by M5N3(1). Specifically, the drain and gate of M5N2(1) are coupled to the gate of M7N3(1). The drain of M7N3(1) is coupled to VDD2. The bias generation circuit 1500 includes a tail current element I4 coupled to the source of M7N2(1) and coupled to ground. An output line VDD2_half-Vth is coupled to the source of M7N3(1) and the tail current element I4. In some embodiments, during operation, the output line VDD2_half-Vth carries a signal of a voltage level that is half of VDD2 minus an NMOS core device $V_{th}$.

Figure 16:
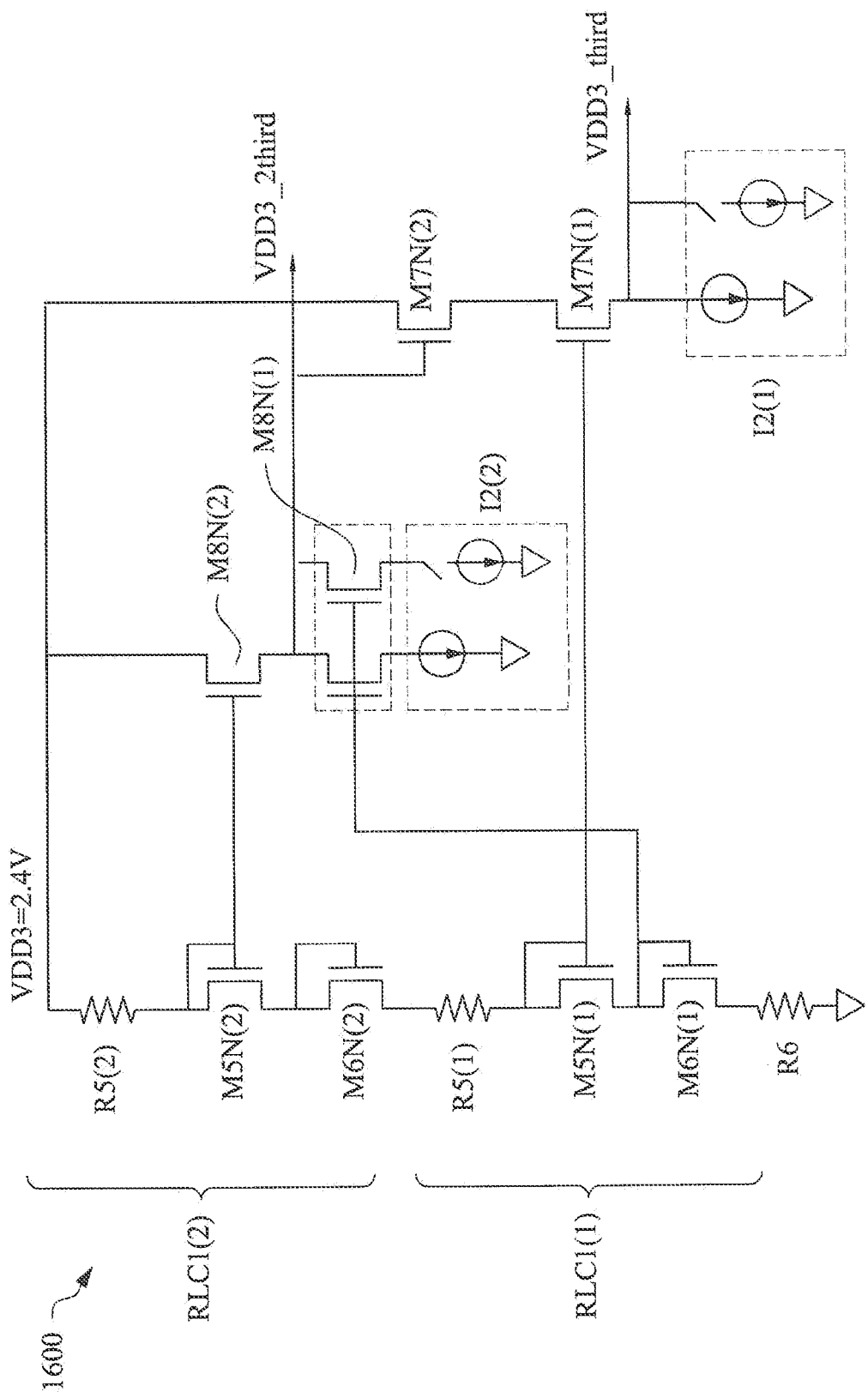
FIG. 16 is an example circuit diagram of a bias generation circuit, in accordance with some embodiments.

FIG. 16 is an example circuit diagram of a bias generation circuit 1600, in accordance with some embodiments. The bias generation circuit 1600 is similar to the bias generation circuit 1300 except that (a) the bias generation circuit 1600 has two resistor ladder cells in series: RLC1(1) and RLC1(2), and (b) the voltage supply is VDD3 (e.g., 3*VDD). RLC1(2) includes a resistive element R5(2), a diode-connected NMOS core device M5N(2) in series with R5(2), and a diode-connected NMOS core device M6N(2) in series with R5(2) and M5N(2). R5(2) is coupled to VDD3. R5(1) is coupled to the source of M6N(2).

The drain of M7N(1) is coupled to a source of an NMOS core device M7N(2). A drain of M7N(2) is coupled to VDD3. An output line VDD3_third is coupled to the source of M7N(1) and the tail current element I2(1). In some embodiments, during operation, the output line VDD3_third carries a signal at a voltage level that is one third of VDD3 (e.g., VDD3/3=VDD).

The bias generation circuit 1600 includes a source follower M8N(2) driven by M5N(2). A drain of M8N(2) is coupled to VDD3. A source of M8N(2) is coupled to a drain of M8N(1). The bias generation circuit 1300 includes a tail current element I2(2) coupled to the source of M8N(1) and coupled to ground. M8N(1) can be multiple NMOS core devices in parallel. A first portion of the NMOS core devices of M8N(1) can be coupled to the fixed portion of I2(2). A second portion of the NMOS core devices of M8N(1) can be coupled to an adjustable portion of I2(2). An output line VDD3_2third is coupled to the source of M8N(2) and the drain of M8N(1). In some embodiments, during operation, the output line VDD3_2third carries a signal at a voltage level that is two-thirds of VDD3 (e.g., 2*VDD3/3=2*VDD).

In one embodiment, the current going through RLC1(1) is 6.7 uA, the resistive elements R5(1), R5(2), and R6 are 80 k ohms, VDD3=2.4V, the voltage level at the gate of M5N(2) is 1.8V, the voltage level at the gate of M5N(1) is 1.0V, the voltage level at the gate of M6N(1) is 0.8V, the voltage level at the source of M8N(1) is 0.6V, the voltage level at the source of M7N(2) is 1.4V, the voltage level of VDD3_2third is 1.6V, and the voltage level of VDD3_third is 0.8V.

Figure 17:
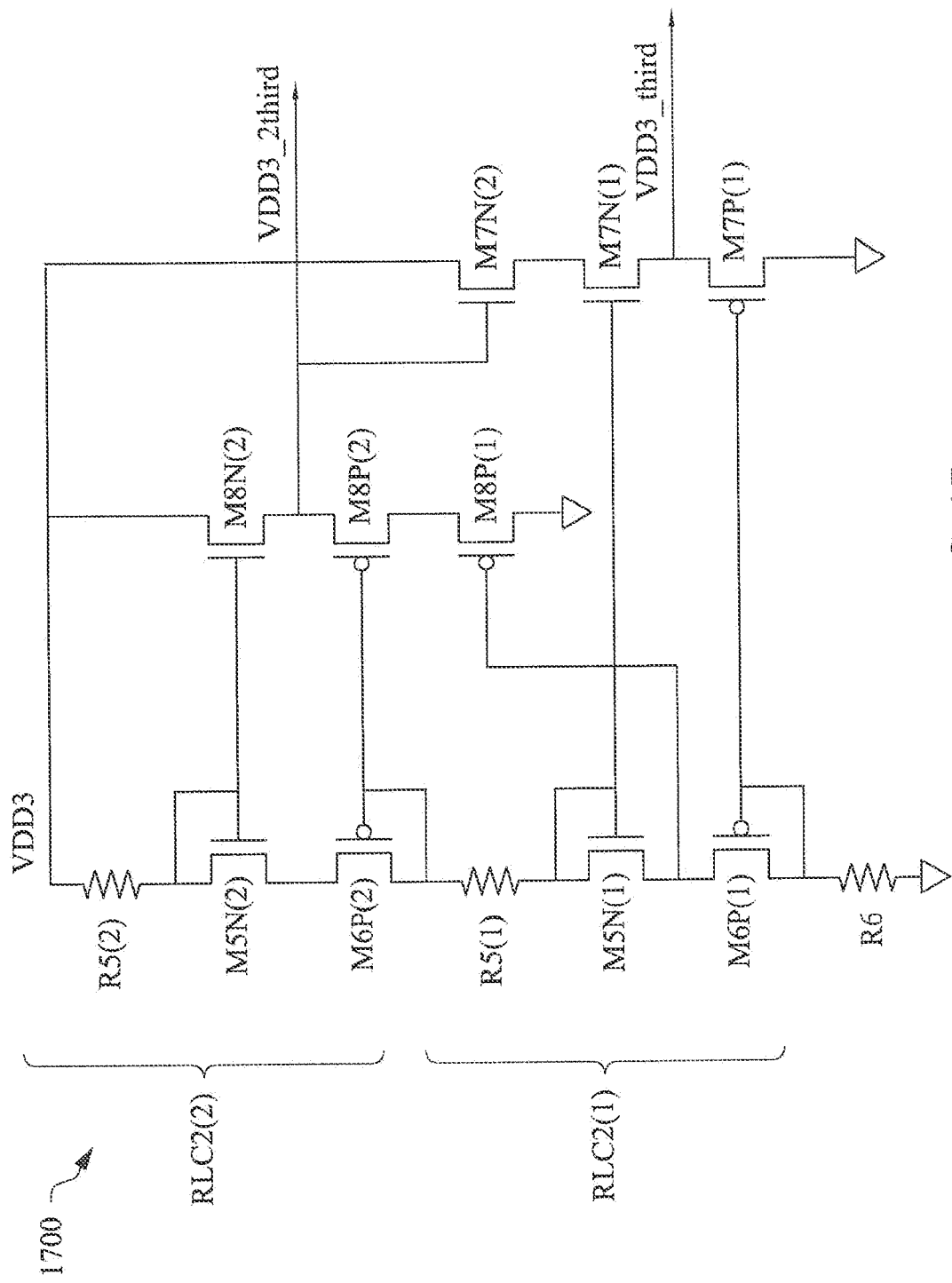
FIG. 17 is an example circuit diagram of a bias generation circuit, in accordance with some embodiments.

FIG. 17 is an example circuit diagram of a bias generation circuit 1700, in accordance with some embodiments. The bias generation circuit 1700 is similar to the bias generation circuit 1600 except that (a) the bias generation circuit 1700 includes RLC2(1) and RLC2(2) rather than RLC1(1) and RLC(2), which are instances of RLC2(1) in FIG. 14, (b) the tail current element I2(1) and I2(2) are shown to include a PMOS source follower M7P(1) and M8P(1), respectively, and (c) the bias generation circuit 1700 includes M8P(2) rather than M8N(1). M7P(1) receives a bias voltage at a gate port of M7P(1) to provide a bias current at a drain port of M7P(1) coupled to the VDD3_third line. M8P(1) receives a bias voltage at a gate port of M8P(1) to provide a bias current at a drain port of M8P(1). M8P(2) receives the bias current at a source port of M8P(2) to provide a voltage at a drain port of M8P(2) coupled to the VDD3_2third line.

Figure 18:
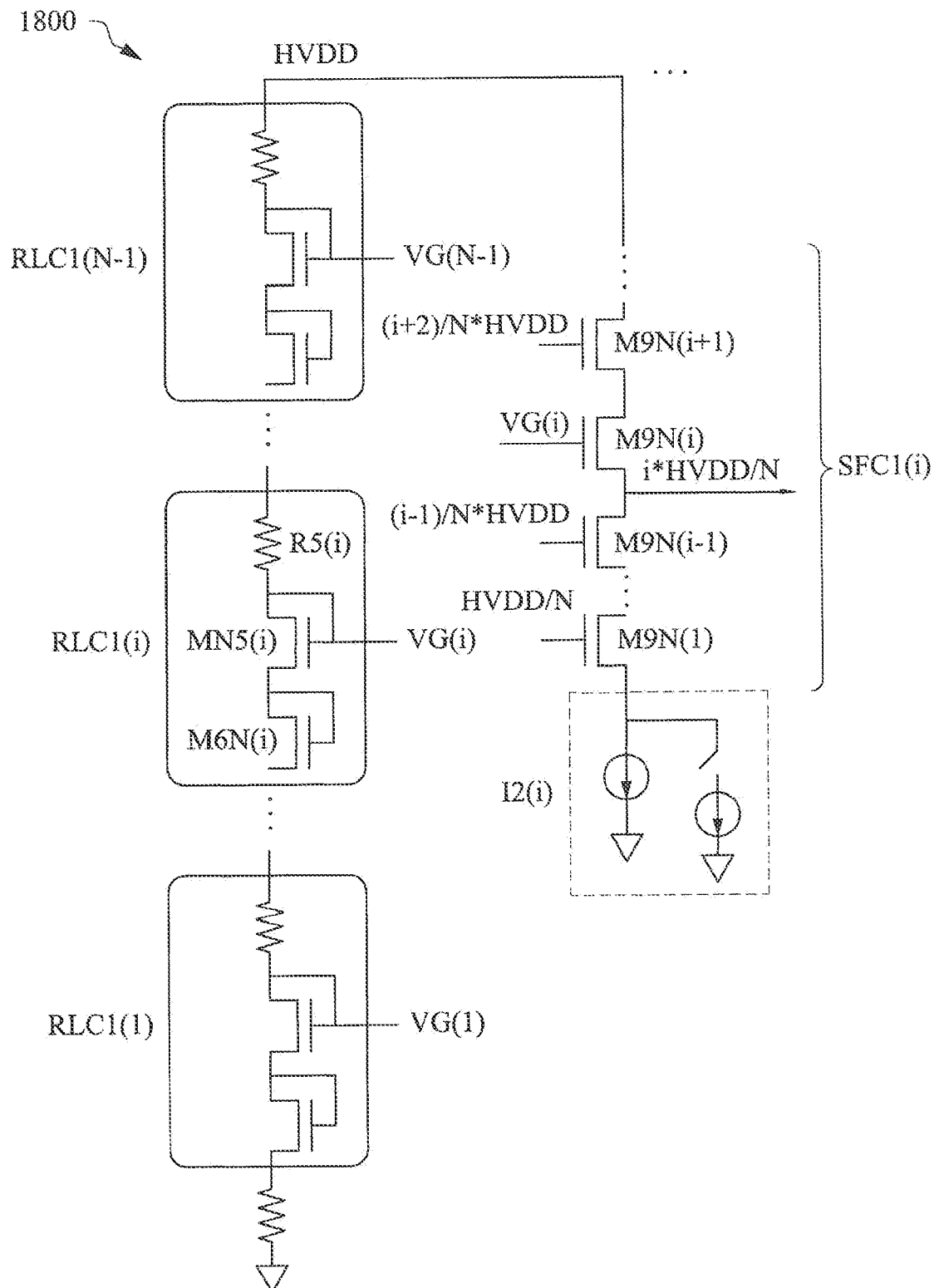
FIG. 18 is an example circuit diagram of a bias generation circuit, in accordance with some embodiments.

FIG. 18 is an example circuit diagram of a bias generation circuit 1800, in accordance with some embodiments. The bias generation circuit 1800 is similar to the bias generation circuit 1300 except that (a) the bias generation circuit 1800 includes N−1 resistor ladder cells in series with each other, in which each resistor ladder cell is configured to provide a different voltage level to a corresponding source follower cell, (b) the bias generation circuit 1800 includes N−1 source follower cells in parallel with each other, (c) each source follower cell includes N−1 NMOS core devices and a tail current element to provide a different fractional voltage level, and (d) the voltage supply is HVDD (e.g., N*VDD).

Specifically, the resistor ladder cells include RLC1(1), . . . , RLC1(i), . . . , RLC1(N−1) coupled in series between a voltage supply and ground to generate a bias current. The operation of each ladder cell is same as the operation of the ladder cell RLC(1) of FIG. 13.

The N−1 source follower cells are coupled, in parallel with each other, between the voltage supply and the ground. Each source follower cell includes a source follower NMOS core device in series with N−2 other NMOS core devices and a tail current element. Each of the source follower cells operate in a same manner. For simplicity, only one source follower cell SFC1(i) is shown. SFC1(i) includes (a) the source follower NMOS core device M9N(i), (b) a tail current element I2(i) coupled to ground, (c) i−1 NMOS core devices coupled in series between M9N(i) and I2(i), and (d) N−i−1 NMOS core devices coupled in series between the voltage supply and M9N(i). The operation of the source follower cell SFC1(i) is similar to the source follower cell of FIG. 13 except that the additional N−2 NMOS core devices are disposed in their respective locations and biased at their respective gates with respective fractional voltages of the power supply in order to protect M9N(i), the tail current element, and each other from breaking down from a voltage drop between the voltage supply and the ground. For example, M9N(1) is biased at a voltage level HVDD/N, M9N(i−1) is biased at a voltage level (i−1)/N*HVDD, M9N(i+1) is biased at a voltage level (i+1)/N*HVDD. In some embodiments, each of the additional N−i−1 NMOS core devices between the power supply and M9N(i) receive their respective bias voltage from an output of a respective source follower cell and each of the additional i−1 NMOS core devices between M9N(i) and the tail current receive their respective bias voltage from a respective node in the N−1 resistor ladder cells (similar to the bias generation circuit 1600 of FIG. 16).

Each source follower cell, such as SFC1(i), is coupled to an output line, a HVDD and a ground rail, and each output line drives the ngate(i) bias line and the pgate(N−i) bias line with a corresponding signal having a corresponding voltage level. Using SFC1(i) as an example, the source of M9N(i) is coupled to an output line i*HVDD/N that generates a signal with a voltage level i*HVDD/N, the drain of M9N(N) is coupled to the voltage supply HVDD and the source of M9N(1) is coupled to the tail current element I2(i), which is in turn coupled to the ground rail.

Figure 19:
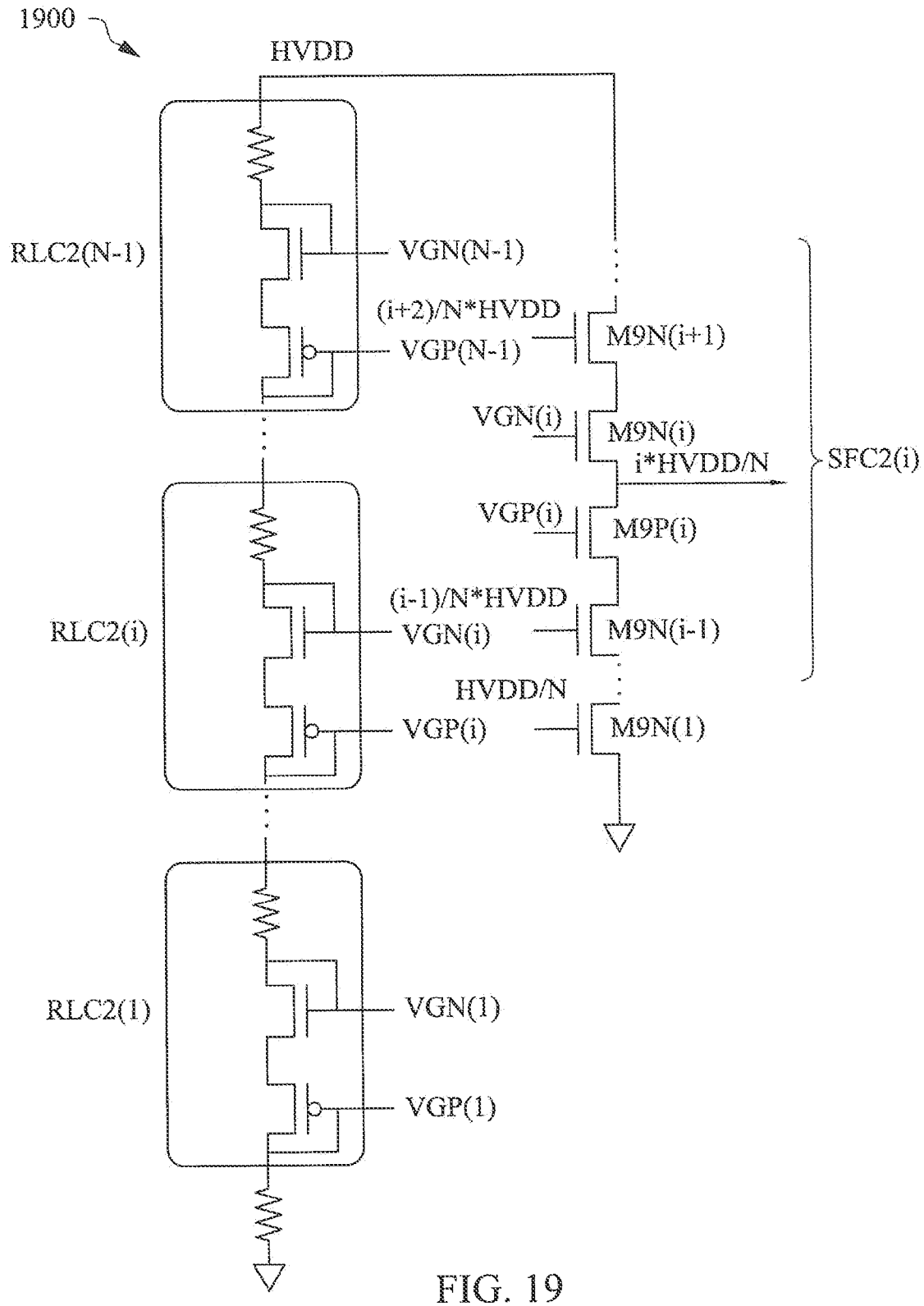
FIG. 19 is an example circuit diagram of a bias generation circuit, in accordance with some embodiments.

FIG. 19 is an example circuit diagram of a bias generation circuit 1900, in accordance with some embodiments. The bias generation circuit 1900 is similar to the bias generation circuit 1800 except that (a) the bias generation circuit 1900 includes RLC2(1), . . . , RLC2(i), . . . , RLC2(N−1) rather than RLC1(1), . . . , RLC1(i), . . . , RLC1(N−1), (b) each source follower cell includes PMOS core devices, e.g., SFC2(i) includes PMOS core devices M9P(2), . . . , M9P(i) in series with each other and the NMOS core devices, as well as coupled between the output line and the tail current element (M9P(2), . . . , M9P(i) replace M9N(1), . . . , M9N(i−1)), and (c) the tail current element is shown to include a PMOS core device M9P(1). Each of the bias generation circuits 1300-1900 may be referred to as a bias circuit or a fractional voltage generator.

Figure 20A:
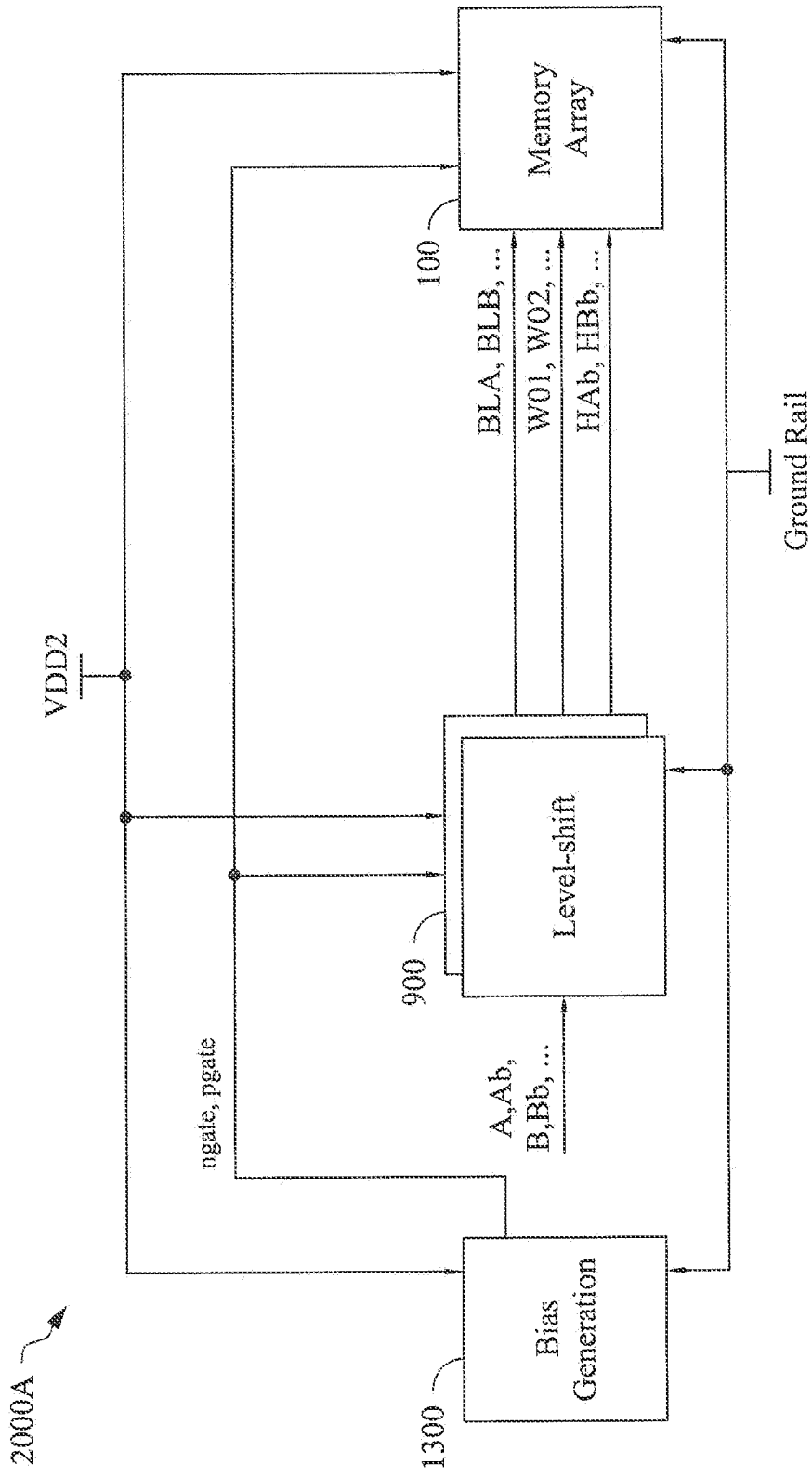
FIG. 20A is an example block diagram of high voltage memory system, in accordance with some embodiments.

FIG. 20A is an example block diagram of high voltage (HV) memory system 2000A, in accordance with some embodiments. The HV memory system 2000A includes double stack circuitry: the bias generation circuit 1300, a plurality of level shift circuit 900 cells, and the memory array 100 (e.g., eFuse circuit). In some embodiments, the memory system 2000A can include one of the bias generation circuits 1400 or 1500 rather than 1300.

Each of the cells (e.g., the bias generation circuit 1300, a plurality of level shift circuit 900 cells, and the memory array 100) receive the voltage supply VDD2 and the ground rail. The bias generation circuit 1300 drives the plurality of level shift circuit 900 cells and the memory array 100 with ngate and pgate lines having a signal with a voltage level V(ngate) and V(pgate), respectively. Each of the level-shift 900 cells receive controls for a corresponding stack pass gate in the memory array 100. For example, a first level-shift 900 cell receives a bits A and Ab, a second level-shift 900 cell receives bits B and Bb, . . . , an Nth level-shift 900 cell receives bits N and Nb. Each level shift 900 cell generates a bit HAb that corresponds to an enable bit of a corresponding stack pass gate (e.g., HAb, HBb, . . . , HNb) and a bit HA2 that corresponds to a bit line bit of the corresponding stack pass gate (e.g., BLA, BLB, . . . , BLN). The memory array 100 receives the level-shifted control bits from the plurality of level shift 900 cells. The memory array 100 receives word line bits (e.g., WL0, WL1, . . . , WLN) corresponding to stack selectors. The memory array 100 changes a state of a corresponding resistive element based on the level-shifted enable bits, level-shifted bit line bits, word line bits, and bias signals.

Figure 20B:
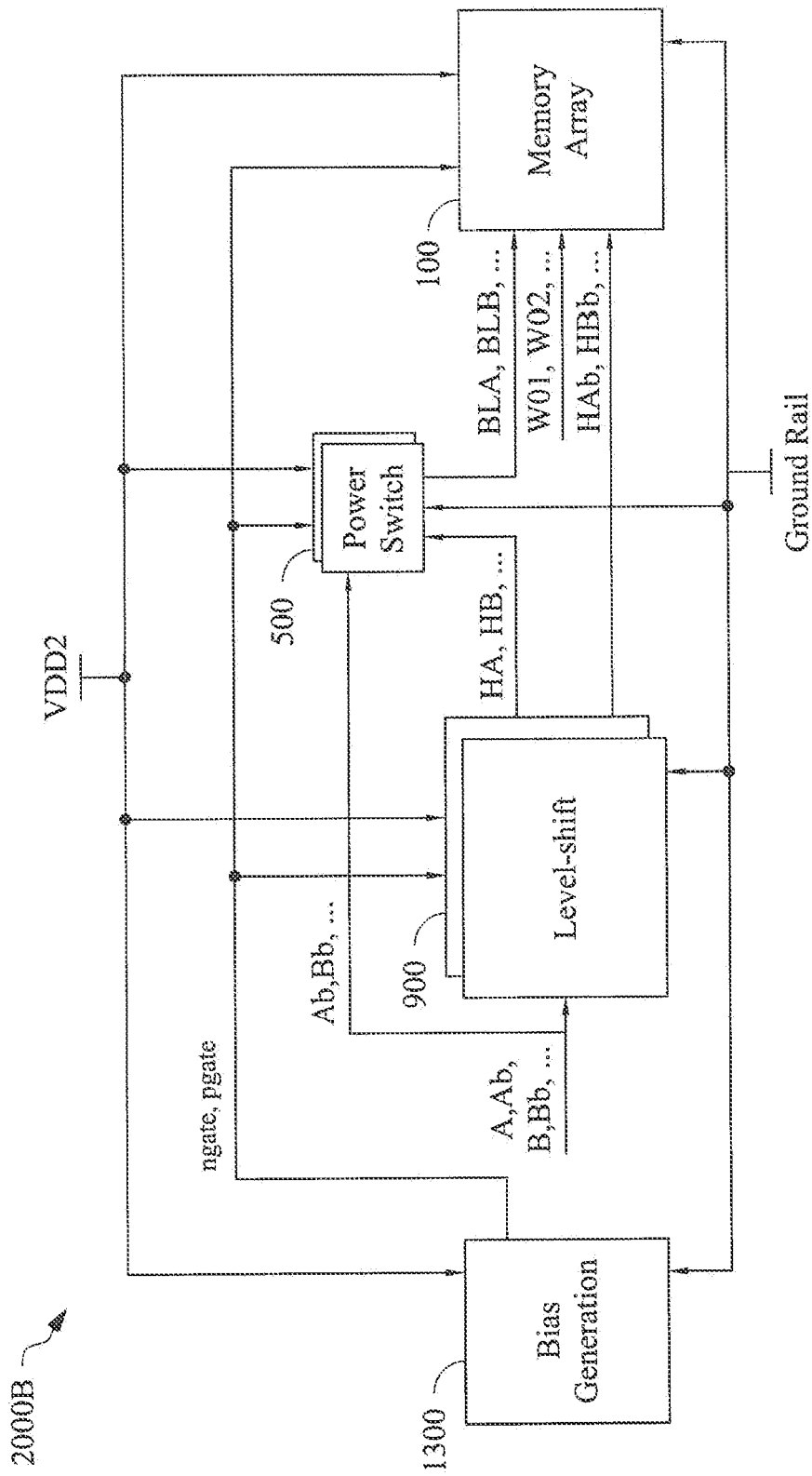
FIG. 20B is an example block diagram of high voltage memory system, in accordance with some embodiments.

FIG. 20B is an example block diagram of HV memory system 2000B, in accordance with some embodiments. The HV memory system 2000B is similar to the HV memory system 2000A except that the HV memory system 2000B includes a plurality of power switch 500 cells. The plurality of power switch 500 cells receives the power supply VDD2 and the ground rail. The plurality of power switch 500 cells receives control bits Ab, Bb, . . . , Nb. The plurality of power switch 500 cells receives level-shifted control bits HA, HB, . . . , HN, from the plurality level-shift 900 cells.

The plurality of power switch 500 cells generates the plurality of bit line bits (e.g., BLA, BLB, . . . , BLN) and sends the bit line bits to the memory array 100, rather than the plurality of level-shift 900 cells sending the bit line bits to the memory array 100. One difference is a lower loading effect due to a higher load impedance of the power switch 500 as compared to a load impedance of the level shift 900.

In some embodiments, PSb with reference to the power switch 500 is same as Ab with reference to a level-shift 900. In some embodiments, for a memory array with N stack pass gates, N power switch 500 cells are used, PSb of a first power switch 500 cell is same as Ab, PSb of a second power switch cell is same as Bb, . . . , PSb of an Nth power switch 500 cell is same as Nb.

Figure 20C:
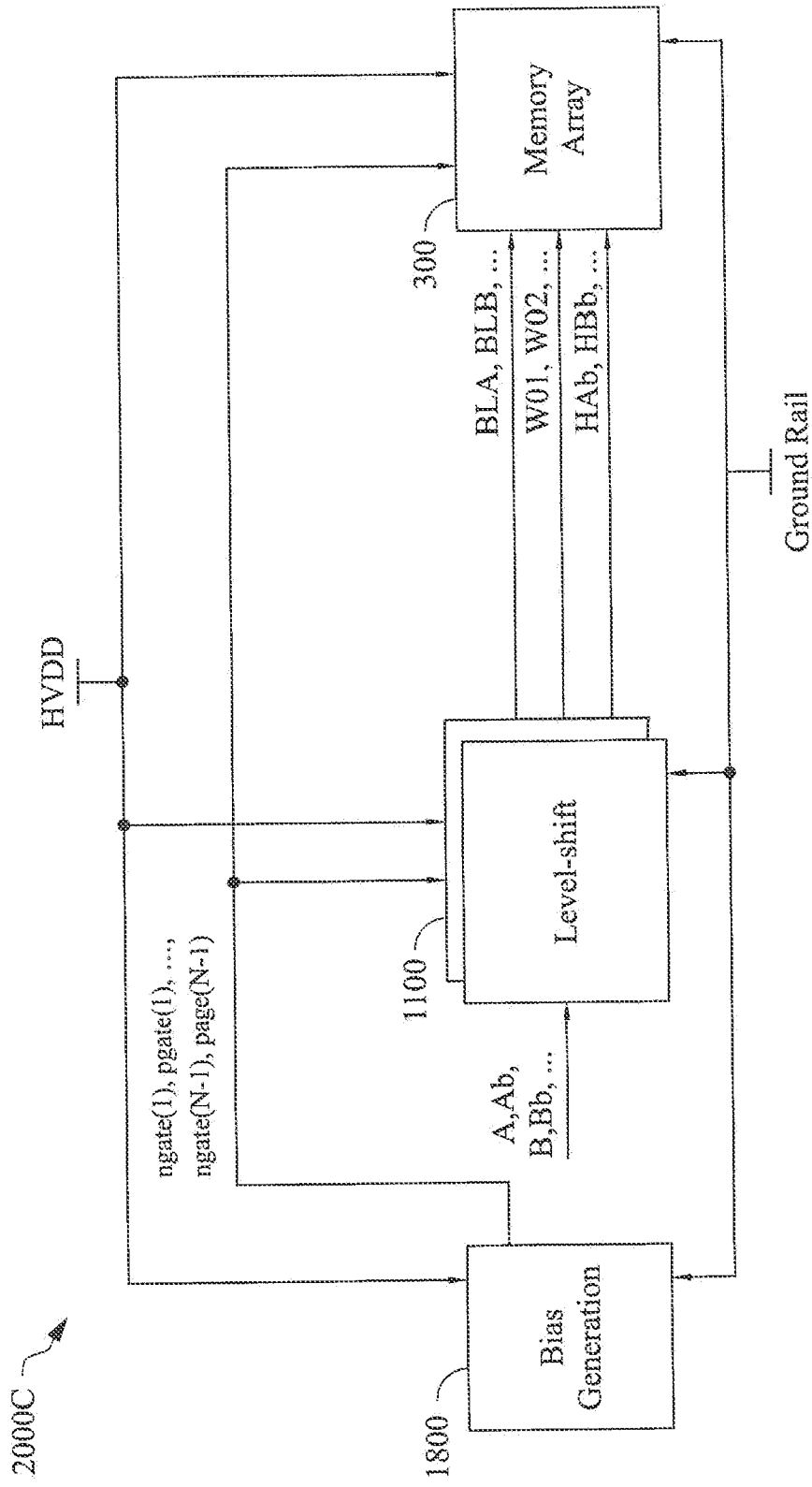
FIG. 20C is an example block diagram of high voltage memory system, in accordance with some embodiments.

FIG. 20C is an example block diagram of high voltage memory system 2000C, in accordance with some embodiments. The HV memory system 2000C is similar to the HV memory system 2000A except that the voltage supply is HVDD and the HV memory system 2000C includes N-stack circuitry rather than the double-stack circuitry. That is, the HV memory system 2000C includes the bias generation circuit 1800, the plurality of level shift circuit 1100 cells, and the memory array 300. In some embodiments, the memory system 2000C can include the bias generation circuit 1900 rather than 1800.

Figure 20D:
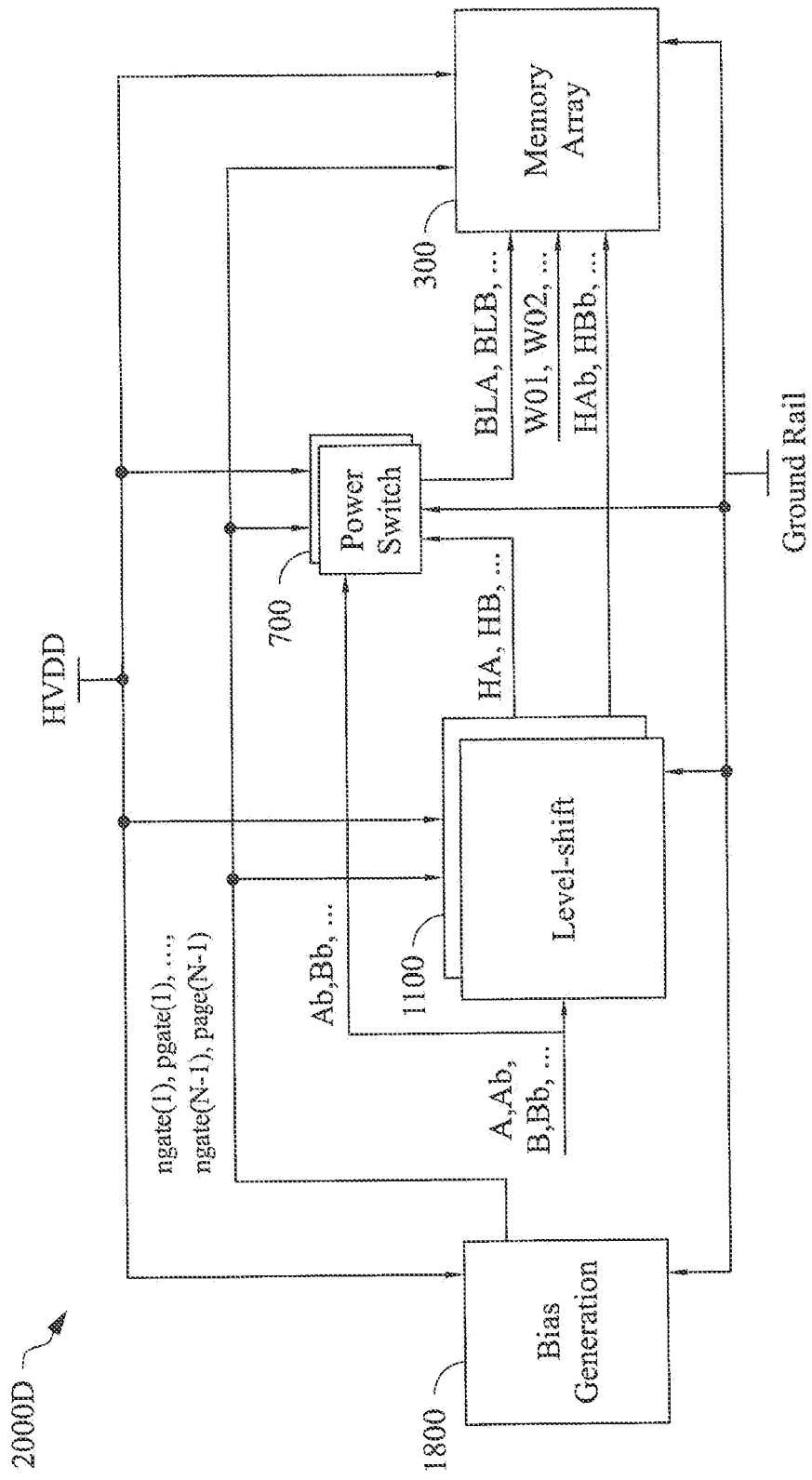
FIG. 20D is an example block diagram of high voltage memory system, in accordance with some embodiments.

FIG. 20D is an example block diagram of high voltage memory system 2000D, in accordance with some embodiments. The HV memory system 2000D is similar to the HV memory system 2000B except that the voltage supply is HVDD and the HV memory system 2000D includes N-stack circuitry rather than the double-stack circuitry. That is, the HV memory system 2000D includes the bias generation circuit 1800, the plurality of level shift circuit 1100 cells, the plurality of power switch 700 cells, and the memory array 300. In some embodiments, the memory system 2000D can include the bias generation circuit 1900 rather than 1800.

FIG. 21 is a flowchart showing a method 2100 of configuring a memory array 100, in accordance with some embodiments. The method 2100 may be performed by the level shift circuit 900 of FIG. 9. In some embodiments, the method 2100 is performed by other entities. In some embodiments, the method 2100 includes more, fewer, or different operations than shown in FIG. 21.

In an operation 2110, the level shift circuit 900 receives a HV voltage signal (e.g., VDD2, HVDD, etc.) and a ground signal. In an operation 2120, the level shift circuit 900 receives cascode bias voltages, e.g., ngate, pgate. In some embodiments, the level shift circuit 900 receives cascode bias voltages from one of the bias generation circuits 1300-1900. In an operation 2130, the level shift circuit 900 receives a bit A that corresponds to a bit line bit in a first voltage domain (e.g., VDD). In an operation 2140, the level shift circuit 900 provides, to the memory array 100, a bit HAb that corresponds to an enable bit of a corresponding stack pass gate (e.g., HAb, HBb, . . . , HNb) in a second voltage domain (e.g., VDD2, HVDD, etc.). In an operation 2150, the level shift circuit 900 provides, to the memory array 100, a bit HA2 that corresponds to a second bit line bit of the corresponding stack pass gate (e.g., BLA, BLB, . . . , BLN) in the second voltage domain. In some embodiments, the level circuit 900 provides the bit HA2, or the like, through a power switch 700. In some embodiments, the memory array 100 receives, from a memory controller coupled to a word line, a word line bit.

Figure 22:
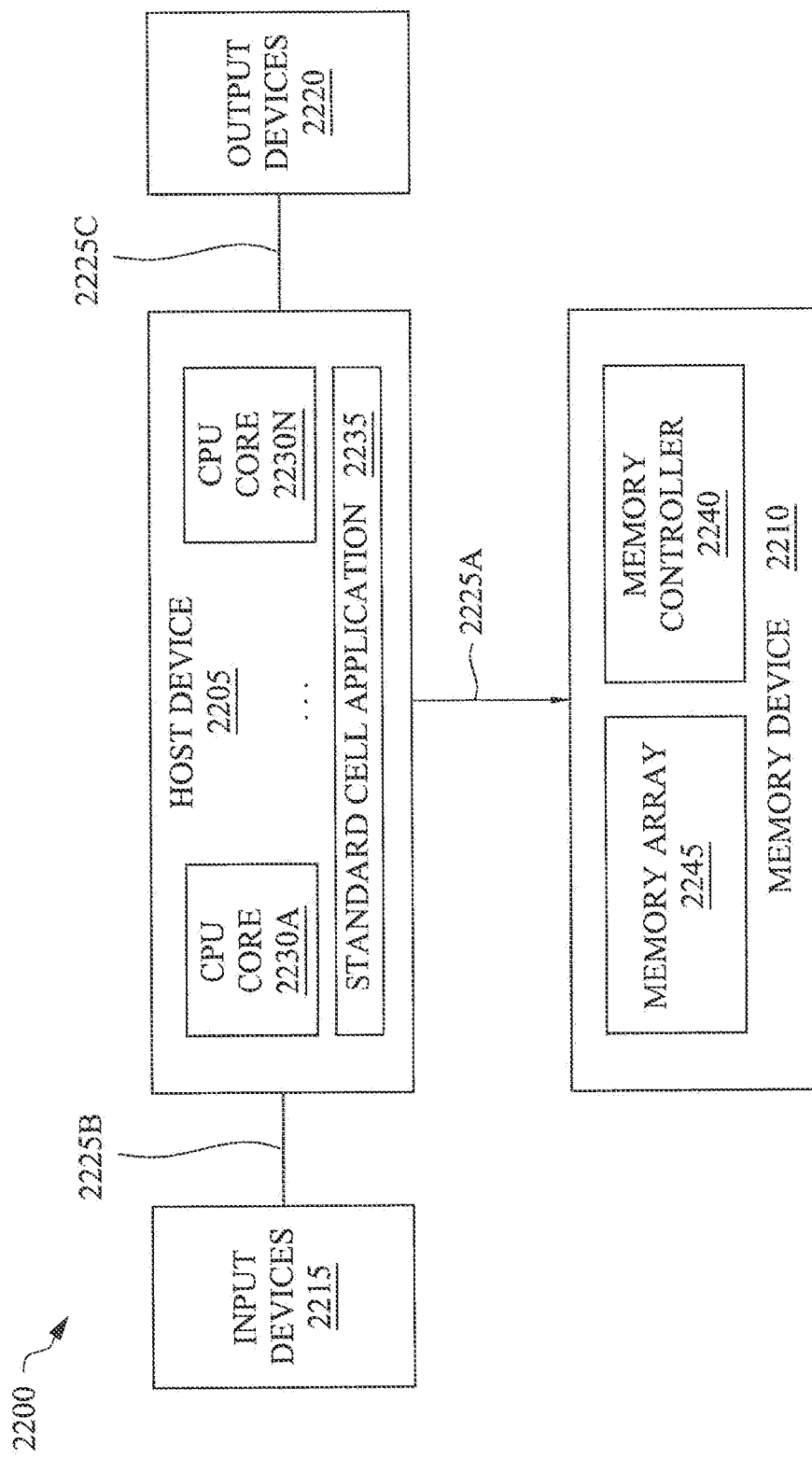
FIG. 22 is a computing system, in accordance with some embodiments.

Referring now to FIG. 22, an example block diagram of a computing system 2200 is shown, in accordance with some embodiments of the disclosure. The computing system 2200 may be used by a circuit or layout designer for integrated circuit design. A "circuit" as used herein is an interconnection of electrical components such as resistors, core devices, switches, batteries, inductors, or other types of semiconductor devices configured for implementing a desired functionality. The computing system 2200 includes a host device 2205 associated with a memory device 2210. The host device 2205 may be configured to receive input from one or more input devices 2215 and provide output to one or more output devices 2220. The host device 2205 may be configured to communicate with the memory device 2210, the input devices 2215, and the output devices 2220 via appropriate interfaces 2225A, 2225B, and 2225C, respectively. The computing system 2200 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 2205.

The input devices 2215 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 2205 and that allows an external source, such as a user (e.g., a circuit or layout designer), to enter information (e.g., data) into the host device and send instructions to the host device. Similarly, the output devices 2220 may include a variety of output technologies such as external memories, printers, speakers, displays, microphones, light emitting diodes, headphones, video devices, and any other output peripherals that are configured to receive information (e.g., data) from the host device 2205. The "data" that is either input into the host device 2205 and/or output from the host device may include any of a variety of textual data, circuit data, signal data, semiconductor device data, graphical data, combinations thereof, or other types of analog and/or digital data that is suitable for processing using the computing system 2200.

The host device 2205 includes or is associated with one or more processing units/processors, such as Central Processing Unit ("CPU") cores 2230A-2230N. The CPU cores 2230A-2230N may be implemented as an Application Specific Integrated Circuit ("ASIC"), Field Programmable Gate Array ("FPGA"), or any other type of processing unit. Each of the CPU cores 2230A-2230N may be configured to execute instructions for running one or more applications of the host device 2205. In some embodiments, the instructions and data to run the one or more applications may be stored within the memory device 2210. The host device 2205 may also be configured to store the results of running the one or more applications within the memory device 2210. Thus, the host device 2205 may be configured to request the memory device 2210 to perform a variety of operations. For example, the host device 2205 may request the memory device 2210 to read data, write data, update or delete data, and/or perform management or other operations. One such application that the host device 2205 may be configured to run may be a standard cell application 2235. The standard cell application 2235 may be part of a computer aided design or electronic design automation software suite that may be used by a user of the host device 2205 to use, create, or modify a standard cell of a circuit. In some embodiments, the instructions to execute or run the standard cell application 2235 may be stored within the memory device 2210. The standard cell application 2235 may be executed by one or more of the CPU cores 2230A-2230N using the instructions associated with the standard cell application from the memory device 2210. In one example, the standard cell application 2235 allows a user to utilize pre-generated schematic and/or layout designs of one of the HV memory systems 2000A-D or a portion of the one of the HV memory systems 2000A-D to aid integrated circuit design. After the layout design of the integrated circuit is complete, multiples of the integrated circuit, for example, including the one of the HV memory systems 2000A-D or a portion of the one of the HV memory systems 2000A-D can be fabricated according to the layout design by a fabrication facility.

Referring still to FIG. 22, the memory device 2210 includes a memory controller 2240 that is configured to read data from or write data to a memory array 2245. The memory controller 2240 or the memory array 2245 may include bias circuitry such as one of the level shift cells 900 or 1100, one of the power switches 500 or 700, or one of the bias generation circuits 1300-1900. The memory array 2245 may include one of the memory arrays 100 or 300. The memory array 2245 may include a variety of volatile and/or non-volatile memories. For example, in some embodiments, the memory array 2245 may include NAND flash memory cores. In other embodiments, the memory array 2245 may include NOR flash memory cores, SRAM cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 2245 may be individually and independently controlled by the memory controller 2240. In other words, the memory controller 2240 may be configured to communicate with each memory within the memory array 2245 individually and independently. By communicating with the memory array 2245, the memory controller 2240 may be configured to read data from or write data to the memory array in response to instructions received from the host device 2205. Although shown as being part of the memory device 2210, in some embodiments, the memory controller 2240 may be part of the host device 2205 or part of another component of the computing system 2200 and associated with the memory device. The memory controller 2240 may be implemented as a logic circuit in either software, hardware, firmware, or combination thereof to perform the functions described herein. For example, in some embodiments, the memory controller 2240 may be configured to retrieve the instructions associated with the standard cell application 2235 stored in the memory array 2245 of the memory device 2210 upon receiving a request from the host device 2205.

It is to be understood that only some components of the computing system 2200 are shown and described in FIG. 22. However, the computing system 2200 may include other components such as various batteries and power sources, networking interfaces, routers, switches, external memory systems, controllers, etc. Generally speaking, the computing system 2200 may include any of a variety of hardware, software, and/or firmware components that are needed or considered desirable in performing the functions described herein. Similarly, the host device 2205, the input devices 2215, the output devices 2220, and the memory device 2210 including the memory controller 2240 and the memory array 2245 may include other hardware, software, and/or firmware components that are considered necessary or desirable in performing the functions described herein.

One aspect of this description relates to a memory array. The memory array includes a plurality of N-stack pass gates. Each N-stack pass gate includes a stage-1 PMOS core device and a stage-N PMOS core device in series with the stage-1 PMOS core device. Each stage-1 PMOS is coupled to a voltage supply. The memory array includes a plurality of enable lines. Each enable line drives a corresponding stage-1 PMOS core device. The memory array includes a plurality of N-stack selectors. Each N-stack selector includes a plurality of NMOS stacks. Each NMOS stack includes a stage-1 NMOS core device. Each stage-1 NMOS core device is coupled to a ground rail. Each NMOS stack includes a stage-N NMOS core device in series with the stage-1 NMOS core device. The memory array includes a plurality of word lines. Each word line is driving the plurality of stage-1 NMOS core devices of a corresponding N-stack selector. The memory array includes a matrix of resistive elements. Each resistive element is coupled between a stage-N PMOS device of a corresponding N-stack pass gate and a stage-N NMOS device of a corresponding NMOS stack of a corresponding N-stack selector. Each voltage supply is greater than a breakdown voltage for each of the stage-1 PMOS core device, the stage-N PMOS core device, the stage-1 NMOS core device, and the stage-N NMOS core device.

In some embodiments, the memory array further includes a plurality of bit lines coupled to a stage-N PMOS device of a corresponding N-stack pass gate. In some embodiments, each resistive element is in a first state. In some embodiments, a first resistive element is coupled between a first stage-N NMOS core device and a first stage-N PMOS core device. In some embodiments, the first resistive element changes to a second state in response to a first word line driving a corresponding first stage-1 NMOS core device with a first bit at a first voltage level above a first predetermined limit and a first enable line driving a corresponding first stage-1 PMOS core device with a second bit at a second voltage below a second predetermined limit.

In some embodiments, the memory array further includes an ngate bias line driving the stage-N NMOS core devices with a signal at a first voltage that is an overdrive voltage ($V_{od}$) greater than a second voltage that a first word line is driving the corresponding stage-1 NMOS core device with. In some embodiments, the memory array further includes a pgate bias line driving the stage-N PMOS core device with a signal at a first voltage that is a $V_{od}$ greater than a second voltage that a first enable line is driving the corresponding stage-1 PMOS core device with.

In some embodiments, each of the plurality of N-stack pass gates includes a stage-2 PMOS core device in series with the corresponding stage-1 PMOS core device and the corresponding stage-N PMOS core device. In some embodiments, each of the plurality of NMOS stacks includes a stage-2 NMOS core device in series with the corresponding stage-1 NMOS core device and the corresponding stage-N NMOS core device.

One aspect of this description relates to a level shift circuit. The level shift circuit includes a first NMOS differential pair coupled to a ground rail, a differential input driving the first NMOS differential pair, a second NMOS differential pair in series with the first NMOS differential pair, and a first PMOS differential pair coupled to a voltage supply. The first PMOS differential pair is cross-coupled. The level shift circuit includes a second PMOS differential pair in series with the first PMOS differential pair, a first differential output coupled between the second NMOS differential pair and the second PMOS differential pair, and a second differential output coupled between the first PMOS differential pair and the second PMOS differential pair. Each of the first NMOS differential pair, the second NMOS differential pair, the first PMOS differential pair, and the second PMOS differential pair includes a pair of core devices, and wherein the voltage supply is greater than a breakdown voltage of each core device.

In some embodiments, in a first state, the differential input is configured to drive each of the first differential output and the second differential output to a first level of the voltage supply and, in a second state, the differential input is configured to drive the first differential output to a second level of the ground rail and drive the second differential output to a midpoint level between the first level and the second level. In some embodiments, the voltage supply is a first voltage supply. In some embodiments, the second differential output drives a pair of buffers coupled between the voltage supply and a second voltage supply.

In some embodiments, the level shift circuit further includes an ngate bias line driving the second NMOS differential pair with a signal at a first voltage that is an overdrive voltage ($V_{od}$) greater than a second voltage that the differential input is driving the first NMOS differential pair with. In some embodiments, the level shift circuit further includes a pgate bias line driving the second PMOS differential pair with a signal having a first voltage that is an $V_{od}$ less than a second voltage that the second differential output is driving the first PMOS differential pair with.

In some embodiments, the level shift circuit further includes a third NMOS differential pair in series with the first NMOS differential pair and the second NMOS differential pair. In some embodiments, the level shift circuit further includes a third PMOS differential pair in series with the first PMOS differential pair and the second PMOS differential pair.

One aspect of this description relates to a bias circuit. The bias circuit includes one or more resistor ladder cells coupled in series. Each resistor ladder cells includes a first diode connected core device, a second diode connected core device in series with the first diode connected core device, a resistive element in series with the first and second diode connected core devices. The bias circuit includes one or more source followers. Each source follower is driven by a corresponding second diode connected core device. The bias circuit includes one or more tail current elements. Each tail current element is in series with a corresponding source follower. The bias circuit includes one or more output bias lines. Each output bias line is coupled between the corresponding source follower and a corresponding tail current element. A first resistor ladder cell is coupled to a voltage supply. The voltage supply is greater than a breakdown voltage for each of the one or more first diode connected core devices, the one or more second diode connected core devices, and the one or more source followers.

In some embodiments, the one or more resistor ladder cells includes N resistor ladder cells. In some embodiments, the output bias line of the first resistor ladder cell outputs a bias voltage with a voltage level of (N−1)/N of a first level of the voltage supply. In some embodiments, each of the first diode connected core devices is a diode connected NMOS core device. In some embodiments, each of the first diode connected core devices is a diode connected PMOS core device.

In some embodiments, each of the tail current elements includes a PMOS core device driven by the diode connected PMOS core device. In some embodiments, each of the tail current elements includes a fixed portion and an adjustable portion in series with a switch. In some embodiments, each resistor ladder cell further includes a third diode connected core device in series with the first and second diode connected core devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory array comprising:
   a plurality of N-stack pass gates, each N-stack pass gate comprising a stage-1 PMOS core device and a stage-N PMOS core device in series with the stage-1 PMOS core device, each stage-1 PMOS coupled to a voltage supply;
   a plurality of enable lines, each enable line driving a corresponding stage-1 PMOS core device;
   a plurality of N-stack selectors, each N-stack selector comprising a plurality of NMOS stacks, each NMOS stack comprising:
      a stage-1 NMOS core device each stage-1 NMOS core device coupled to a ground rail; and
      a stage-N NMOS core device in series with the stage-1 NMOS core;
   a plurality of word lines, each word line driving the plurality of stage-1 NMOS core devices of a corresponding N-stack selector; and
   a matrix of resistive elements, each resistive element coupled between a stage-N PMOS device of a corresponding N-stack pass gate and a stage-N NMOS device of a corresponding NMOS stack of a corresponding N-stack selector;
   wherein each voltage supply is greater than a breakdown voltage for each of the stage-1 PMOS core device, the stage-N PMOS core device, the stage-1 NMOS core device, and the stage-N NMOS core device.

2. The memory array of claim 1, further comprising a plurality of bit lines coupled to a stage-N PMOS device of a corresponding N-stack pass gate.

3. The memory array of claim 1, wherein each resistive element is in a first state, wherein a first resistive element is coupled between a first stage-N NMOS core device and a first stage-N PMOS core device, and wherein the first resistive element changes to a second state in response to:
   a first word line driving a corresponding first stage-1 NMOS core device with a first bit at a first voltage level above a first predetermined limit; and
   a first enable line driving a corresponding first stage-1 PMOS core device with a second bit at a second voltage below a second predetermined limit.

4. The memory array of claim 1, further comprising:
   an ngate bias line driving the stage-N NMOS core devices with a first voltage that is an overdrive voltage ($V_{od}$) greater than a second voltage that a first word line is driving the corresponding stage-1 NMOS core device with; and
   a pgate bias line driving the stage-N PMOS core device with a first voltage that is a $V_{od}$ greater than a second voltage that a first enable line is driving the corresponding stage-1 PMOS core device with.

5. The memory array of claim 1, wherein each of the plurality of N-stack pass gates comprises a stage-2 PMOS core device in series with the corresponding stage-1 PMOS core device and the corresponding stage-N PMOS core device.

6. The memory array of claim 1, wherein each of the plurality of NMOS stacks comprises a stage-2 NMOS core device in series with the corresponding stage-1 NMOS core device and the corresponding stage-N NMOS core device.

* * * * *